US006795339B2

(12) United States Patent
Ooishi

(10) Patent No.: US 6,795,339 B2
(45) Date of Patent: Sep. 21, 2004

(54) THIN FILM MAGNETIC MEMORY DEVICE HAVING COMMUNICATION FUNCTION, AND DISTRIBUTION MANAGEMENT SYSTEM AND MANUFACTURING STEP MANAGEMENT SYSTEM EACH USING THEREOF

(75) Inventor: Tsukasa Ooishi, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 40 days.

(21) Appl. No.: 10/219,270

(22) Filed: Aug. 16, 2002

(65) Prior Publication Data

US 2003/0156449 A1 Aug. 21, 2003

(30) Foreign Application Priority Data

Feb. 18, 2002 (JP) ........................................ 2002-040093

(51) Int. Cl.⁷ ................................................. G11C 7/00
(52) U.S. Cl. ..................... 365/171; 365/173; 365/97; 365/87; 365/74; 365/66; 365/48
(58) Field of Search .............................. 365/171, 173, 365/97, 87, 74, 66, 48

(56) References Cited

U.S. PATENT DOCUMENTS

| 5,940,319 A | 8/1999 | Durlam et al. |
| 2001/0010938 A1 * | 8/2001 | Bronner et al. ................. 438/3 |

FOREIGN PATENT DOCUMENTS

| JP | 363061405 A | * | 3/1988 | ............ G11B/5/31 |
| JP | 401055716 A | * | 3/1989 | ............ G11B/5/31 |
| JP | 407183458 A | * | 7/1995 | ............ H01L/27/04 |
| JP | 407309032 A | * | 11/1995 | ............ B41J/2/42 |
| JP | 8-315247 | | 11/1996 | |
| JP | 411163128 A | * | 6/1999 | ......... H01L/21/768 |
| JP | 2000-57282 | | 2/2000 | |
| JP | 2000-59260 | | 2/2000 | |

OTHER PUBLICATIONS

Scheurlein et al., "A 10ns Read and Write Non–Volatile Memory Array Using a Magnetic Tunnel Junction and FET Switch in Each Cell", ISSCC Digest of Technical Papers, TA7.2, Feb. 2000, pp. 94–95, 128–129, 409–410.

Durlam et al., "Nonvolatile RAM based on Magnetic Tunnel Junction Elements", ISSCC Digest of Technical Papers, TA7.3, Feb. 2000, pp. 96–97, 130–131, 410–411.

* cited by examiner

*Primary Examiner*—Viet Q. Nguyen
(74) *Attorney, Agent, or Firm*—McDermott Will & Emery LLP

(57) ABSTRACT

A thin film magnetic memory device includes an antenna section transmitting and receiving a radio wave to an from an outside of the thin film magnetic memory device. An inductance wiring constituting the antenna section has a metal wiring, and a magnetic film formed to correspond to a lower surface portion of the metal wiring or lower surface and side surface portions of the metal wiring. The magnetic film is formed in an original manufacturing step of the thin film magnetic memory device without providing a dedicated manufacturing step.

11 Claims, 17 Drawing Sheets

FIG.1
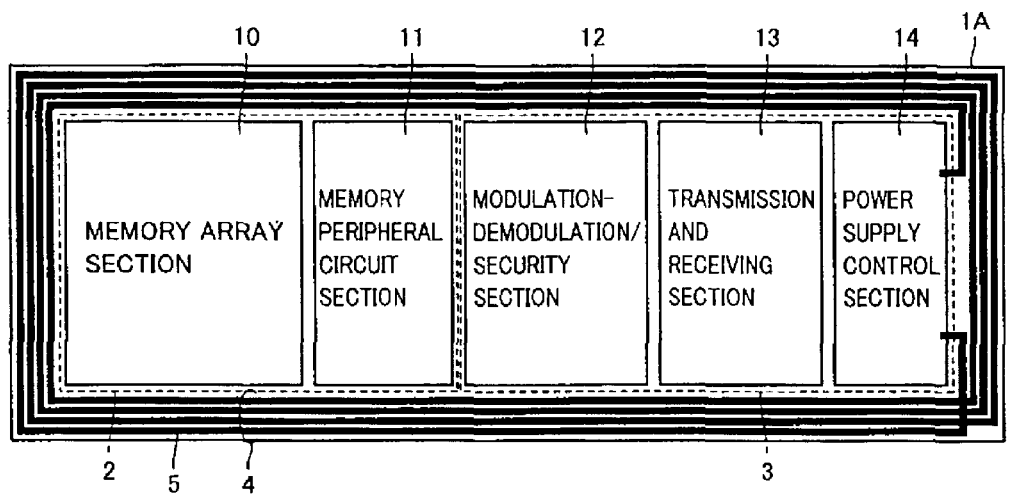
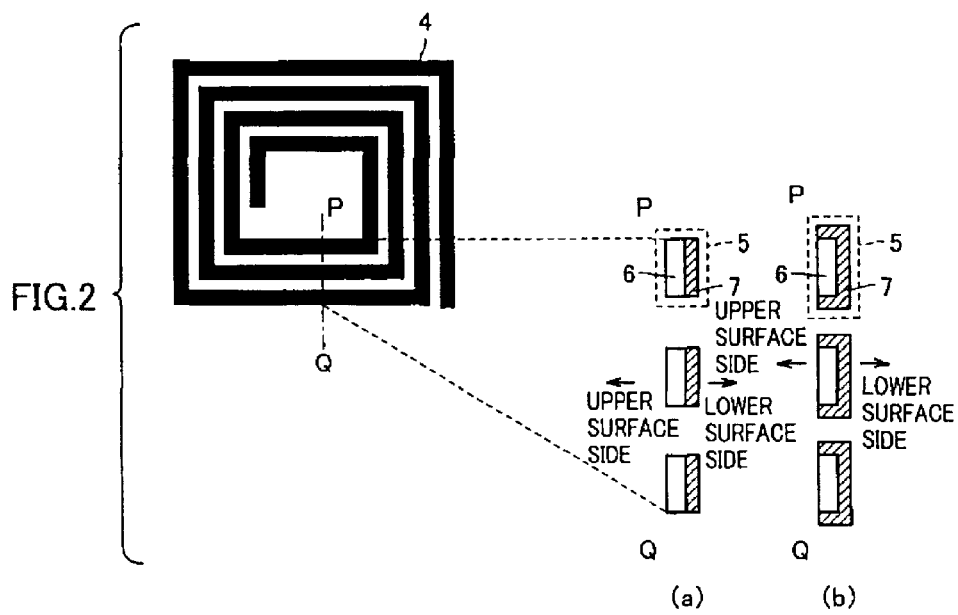
FIG.2

THIN FILM MAGNETIC MEMORY DEVICE HAVING COMMUNICATION FUNCTION, AND DISTRIBUTION MANAGEMENT SYSTEM AND MANUFACTURING STEP MANAGEMENT SYSTEM EACH USING THEREOF

BACKGROUND OF THE INVENTION

1. Field of the Invention

The present invention relates to a thin film magnetic memory device having a magnetic film and a communication function as well as a radio chip, a distribution management system and a manufacturing process management system each using the thin film magnetic memory device.

2. Description of the Related Art

Attention has been paid to an MRAM (Magnetic Random Access Memory) device serving as a memory capable of storing nonvolatile data with lower consumption power. The MRAM device is a memory which stores data in a nonvolatile manner using a plurality of thin film magnetic elements formed on a semiconductor integrated circuit and which can randomly access the respective thin film magnetic bodies.

In recent years, it is particularly made public that the performance of the MRAM device surprisingly advances by using a thin film magnetic body utilizing a magnetic tunnel junction (MTJ) as a memory cell. The MRAM device which includes memory cells having magnetic tunnel junctions is disclosed in technical documents such as "A 10 ns Read and Write Non-Volatile Memory Array Using a Magnetic Tunnel Junction and FET Switch in each Cell", ISSCC Digest of Technical Papers, TA7.2, February 2000 and "Nonvolatile RAM based on Magnetic Tunnel Junction Elements", ISSCC Digest of Technical Papers, TA7.3, February 2000.

FIG. 17 is a schematic diagram showing the configuration of a memory cell having a magnetic tunnel junction (which memory cell will be also referred to simply as "MTJ" memory cell hereinafter).

Referring to FIG. 17, the MTJ memory cell includes a tunnel magneto-resistance element TMR having electric resistance changing according to the data level of magnetically written, stored data, and an access element ATR. Access transistor ATR is connected to tunnel magneto-resistance element TMR in series between a bit line BL and a source line SL. Access element ATR is typically formed out of a field effect transistor.

Bit line BL for carrying a data write current and a data read current during data write and data read, respectively, a write digit line WDL for carrying the data write current during data write, a word line WL for instructing data to be read, and source line SL for pulling down the voltage of tunnel magneto-resistance element TMR to a ground voltage GND during data read are arranged for the MTJ memory cell.

During data read, tunnel magneto-resistance element TMR is electrically connected between source line SL (ground voltage GND) and bit line BL when access transistor ATR is turned on.

FIG. 18 is a conceptual view for explaining a data write operation for writing data to the MTJ memory cell.

Referring to FIG. 18, tunnel magneto-resistance element TMR includes a magnetic body layer which has a fixed magnetization direction (which layer will be also simply referred to as "fixed magnetic layer" hereinafter) FL and a magnetic body layer which is magnetized in a direction according to a data write magnetic field generated by the data write current (which layer will be also simply referred to as "free magnetic layer" hereinafter) VL. A tunneling barrier TB formed out of an insulating film is provided between fixed magnetic layer FL and free magnetic layer VL. Free magnetic layer VL is magnetized in the same direction as or the opposite direction to the magnetization direction of fixed magnetic layer FL in accordance with the level of written, stored data.

The electric resistance of tunnel magneto-resistance element TMR changes according to the relative relationship in magnetization direction between fixed magnetic layer FL and free magnetic layer VL. Specifically, if the magnetization layer of fixed magnetic layer FL is the same as (parallel to) that of free magnetic layer VL, the electric resistance of tunnel magneto-resistance element TMR becomes lower than that of tunnel magneto-resistance element TMR if the magnetization direction of fixed magnetic layer FL is opposite (anti-parallel) to that of free magnetization direction FL.

During data write, word line WL is inactivated and access transistor ATR is turned off. In this state, data write currents for magnetizing free magnetic layer VL are applied to bit line BL and write digit line WDL, respectively in accordance with the level of written data. That is, the magnetization direction of free magnetic layer VL is determined according to the directions of the data write currents carried to write digit line WDL and bit line BL, respectively.

FIG. 19 is a conceptual view showing the relationship between the data write current and the magnetization direction of the MTJ memory cell.

Referring to FIG. 19, the horizontal axis Hx indicates the direction of a magnetic field H(WDL) generated by the data write current carried to write digit line WDL. The vertical axis Hy indicates a magnetic field H(BL) generated by the data write current carried to bit line BL.

The magnetization direction of free magnetic layer VL is updated only if the sum of magnetic fields H(WDL) and H(BL) reaches an external region of an asteroid characteristic line shown. That is, to execute data write, it is necessary to carry a sufficient data write current to generate a magnetic field having an intensity exceeding a predetermined intensity to both of write digit line WDL and bit line BL.

On the other hand, if a magnetic field corresponding to the inner region of the asteroid characteristic line is applied, the magnetization direction of free magnetic layer VL has no changed. Namely, if a predetermined data write current is applied only to one of write digit line WDL and bit line BL, data write is not executed. The magnetization direction which has been written to the MTJ memory cell, i.e., stored data level is held in a nonvolatile manner until new data is written. As indicated by the asteroid characteristic line, it is possible to decrease a necessary magnetization threshold to change the magnetization direction along a magnetization easy axis by applying a magnetic field in a magnetization hard axis direction to free magnetic layer VL.

FIG. 20 is a conceptual view for explaining a data read operation for reading data from the MTJ memory cell.

Referring to FIG. 20, during data read, access transistor ATR is turned on in response to the activation of word line WL. As a result, tunnel magneto-resistance element TMR is electrically connected to bit line BL while being pulled down to ground voltage GND. In this state, by applying a data read current Is to a current path including bit line BL and tunnel magneto-resistance element TMR, voltage change according to the electric resistance of tunnel magneto-resistance element TMR, i.e., the level of the stored data of the MTJ memory cell can be generated in bit line BL. For example, if precharging bit line BL with a predetermined voltage and then starting the supply of data read current Is, it is possible to read the data stored in the MTJ memory cell by detecting the voltage of bit line BL.

FIG. 21 is a block diagram of an MTJ memory cell formed on a semiconductor substrate.

Referring to FIG. 21, access transistor ATR formed on a semiconductor substrate SUB includes source/drain regions 310 and 320 which are n-type regions, and a gate 330. Source/drain region 310 is electrically connected to source line SL through a metal film formed in a contact hole 341.

Write digit line WDL is formed on a metal wiring layer formed on the upper layer of source line SL. Tunnel magneto-resistance element TMR is electrically connected to source/drain region 320 of access transistor ATR through a metallic film formed on a strap 345 and a contact hole 340. Strap 345 is provided to electrically connect tunnel magneto-resistance element TMR to access transistor ATR and is formed out of a conductive material.

Bit line BL is electrically connected to tunnel magneto-resistance element TMR and provided on the upper layer of tunnel magneto-resistance element TMR. As already described, during data write, it is necessary to carry a data write current to each of bit line BL and write digit line WDL. During data read, if word line WL is activated to, for example, a high voltage state, access transistor ATR is turned on. As a result, tunnel magneto-resistance element TMR pulled down to ground voltage GND is electrically connected to bit line BL through access transistor ATR.

Bit line BL to which a data write current and a data read current is applied and write digit line WDL to which a data write current is applied are each formed using a metal wiring layer. On the other hand, word line WL is provided to control the gate voltage of access transistor ATR, so that it is unnecessary to actively carry a current to word line WL. Accordingly, from a viewpoint of enhancing integration, word line WL is normally formed on the same wiring layer as that of gate 330 by using a polysilicon layer, a polyside layer or the like without the need to newly provide an independent metal wiring layer.

FIG. 22 is a top view of the MTJ memory cell having a structure shown in FIG. 21.

Referring to FIG. 22, the MTJ memory cell is arranged to correspond to the intersection between word line WL and bit line BL arranged in a mesh. As shown in FIG. 21, tunnel magneto-resistance element TMR in each MTJ memory cell is connected to corresponding bit line BL through contact hole 342.

In the meantime, as a memory capable of reading and writing data in a non-contact manner, a so-called radio chip which has a radio communication function for communicating with the outside of the memory by a loop antenna or the like and a data storage function by the nonvolatile memory has been developed.

Japanese Patent Laying-Open No. 8-315247 discloses an article management method by employing such a radio chip as a data carrier. According to this article management method, management data on the manufacturing, sales, maintenance and the like of articles is written to the radio chip and the radio chip is included in each article or the like. That is, by reading stored data from the radio chip employed as a data carrier, writing additional data thereto or changing the data in an article distribution process, it is possible to efficiently conduct distribution, sales, examination, inspection and the like.

Further, as disclosed by Japanese Patent Laying-Open Nos. 2000-57282 and 2000-59260, a radio chip of this type can be also utilized as a so-called non-contact type IC card.

Normally, an EEPROM (electrically erasable programmable read only memory) or a flash EEPROM is employed as a nonvolatile memory included in such a radio chip. Each of these memories, however, requires relatively high voltage for a data rewrite operation and a data erasure operation. For that reason, it is undesirable to mount such a memory on a radio chip the internal generation power of which is limited. In other words, the development of a radio chip requiring lower consumption power is desired.

Furthermore, to enhance the communication capability of the radio chip, i.e., to increase a communicable distance, it is necessary to secure the inductance value of an antenna section. Due to this, according to a conventional radio chip, a communication capability and a chip size holds a trade-off relationship, making it difficult to provide a radio chip smaller in size. As a result, it is particularly difficult to apply a radio chip to a thin film target such as a paper product.

SUMMARY OF THE INVENTION

It is an object of the present invention to provide a thin film magnetic memory device which can be made small in size and reduce consumption power and which can establish non-contact data communication with the outside of the memory, as well as a radio chip, a distribution management system and a manufacturing process management system each using the thin film magnetic memory device.

In short, according to one aspect of the present invention, there is provided a thin film magnetic memory device formed on a substrate, including: a conductive wiring formed on the substrate; and a first magnetic film selectively formed on at least one of surfaces of the conductive wiring on the substrate to correspond to at least a portion right under the conductive wiring.

Therefore, the main advantage of the present invention is in that the inductance value of the conductive wiring can be increased by utilizing a magnetic film manufacturing step which is necessarily included in the steps of manufacturing the thin film magnetic memory device.

It is preferable that the thin film magnetic memory device further includes: a memory array section having a plurality of magnetic memory cells each having a second magnetic film for magnetically holding stored data, arranged therein; an array peripheral circuit section for reading and writing the stored data from and to the memory array section; an antenna section constituted out of the conductive wiring formed into the loop; and a peripheral circuit section for generating an operation instruction to the peripheral circuit section based on a radio wave received by the antenna section.

Therefore, the antenna section for communicating with the outside is constituted using the inductance wiring having an increased inductance value, whereby the antenna section which is formed small in size and thin can secure communication capability.

It is also preferable that the peripheral circuit section includes a power supply control section generating an operating power supply voltage of the thin film magnetic memory device using an induced current generated on the conductive wiring by the radio wave as a source.

Therefore, the operating power supply voltage can be secured by an induced current generated by the radio wave received by the antenna section. As a result, it is possible to semipermanently use the thin film magnetic memory device capable of operating with low consumption power without requiring high voltage unlike EEPROM or the like, without the need to consider the service life of a battery.

According to yet another aspect of the present invention, there is provided a distribution management system, including: a tag chip integrally embedded into a distributed article; a database section for collating and registering management data on the distributed article; a management data read device for reading the management data from the tag chip in a nonvolatile manner, and collating the read management data for the database section; and a management data write device wiring the management data from the tag chip in a nonvolatile manner, and collating the read management data for the database section. The tag chip includes a thin film magnetic memory device having a memory array section arranged therein a plurality of magnetic memory cells magnetically holding the management data. The thin film magnetic memory device includes: an array peripheral circuit section for reading and writing data from and to the memory array section; an antenna section constituted out of a conductive wiring having at least a lower surface covered with a magnetic film; a power supply control section for generating an operating power supply voltage of the tag chip using an induced current generated on the conductive wiring by a radio wave received by the antenna section as a source; and a transmission and receiving section for instructing the array peripheral circuit section to read and write the management data stored in the memory array section based on the radio wave received by the antenna section between the management data read device and the management data write device.

Such a distribution management system can manage distribution by non-contact transmission and receiving of management data using the thin film magnetic memory device including the small-sized antenna as a tag chip. By making the antenna smaller and thinner, in particular, it is possible to expand the range of distributed articles the distribution of which can be managed. Further, since the tag chip which uses the thin film magnetic memory device can be sufficiently supplied with operating power by an external radio wave, it is unnecessary to consider the service life of a battery.

According to still another aspect of the present invention, there is provided a manufacturing process management system including: an ID chip added to a semifinished article subjected to a plurality of predetermined manufacturing processes; and a process management device transmitting and receiving to and from the ID chip in a non-contact manner in each of the manufacturing processes. The ID chip includes a thin film magnetic memory device having a memory array section having arranged therein a plurality of memory cells magnetically holding the process management data. The thin film magnetic memory device includes: an array peripheral circuit section for reading and writing data from and to the memory array section; an antenna section constituted out of a conductive wiring having at least a lower surface covered with a magnetic film; a power supply control section generating an operating power supply voltage of the tag chip using an induced current generated on the conductive wiring by a radio wave received by the antenna section as a source; and a transmission and receiving section for instructing the array peripheral circuit section to read and write the management data stored in the memory array section based on the radio wave received by the antenna section between the management data read device and the management data write device.

Such a manufacturing process management system can manage the manufacturing processes by the non-contact transmission and receiving of management data using the thin film magnetic memory device including the small-sized antenna as an ID chip. By making the antenna thinner and smaller, in particular, it is possible to apply this manufacturing process management system to the manufacturing processes of a very small or thin film product. Furthermore, since the ID chip which uses the thin film magnetic memory device can be sufficiently supplied with operating power by an external radio wave, it is unnecessary to consider the service life of a battery.

Preferably, if the semifinished article has been subjected to all of the plurality of predetermined manufacturing processes, the ID chip is removed and the removed ID chip is added to another semifinished article after the process management data is reregistered.

Since process management data is reregistered in the ID chip removed from the finished article and the ID chip is added to another semifinished article, it is also possible to semipermanently, repeatedly use the ID chip.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing the configuration of a thin film magnetic memory device according to the first embodiment of the present invention;

FIG. 2 is a conceptual view showing the arrangement and structure of an inductance wiring shown in FIG. 1;

DESCRIPTION OF THE PREFERRED EMBODIMENTS

Figure 3:
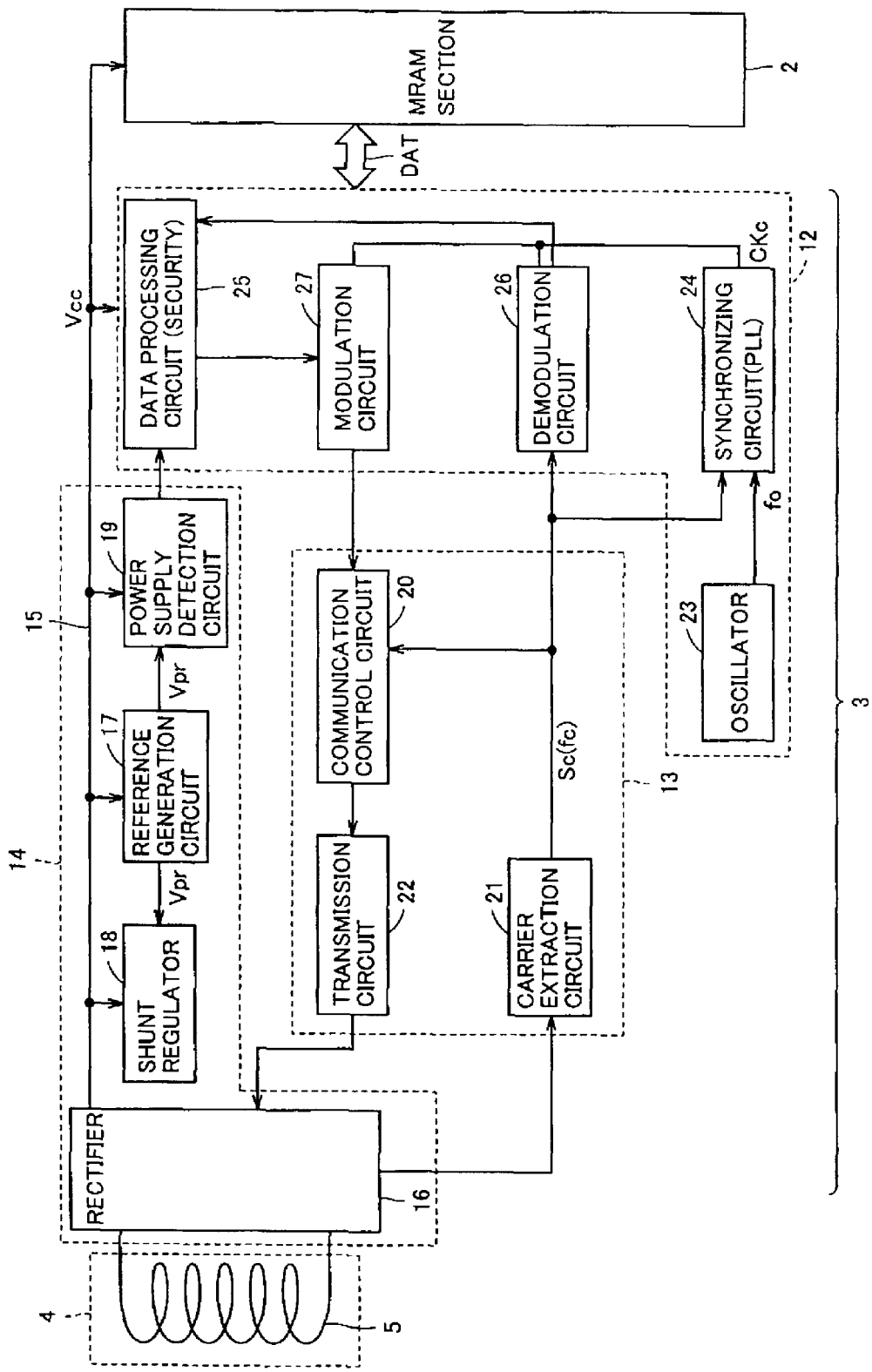
FIG. 3 is a block diagram for explaining the configuration of a peripheral circuit section shown in FIG. 1 in detail.

The embodiments of the present invention will be described hereinafter in detail with reference to the drawings. It is noted that same reference symbols denote the same or corresponding elements throughout the drawings.

First Embodiment

Referring to FIG. 1, a thin film magnetic memory device 1A according to the first embodiment includes an MRAM section 2 which stores data in a nonvolatile manner, a peripheral circuit section 3 which controls the transmission and receiving of data between MRAM section 2 and the outside of memory 1A, and an antenna section 4 which transmits and receives a radio wave to and from the outside of memory 1A. Antenna section 4 is formed out of an inductance wiring 5 formed into a loop on the outer periphery of a chip. Peripheral circuit section 3 controls the operation of MRAM section 2 based on the radio wave transmitted and received to and from the outside of memory 1A by antenna section 4.

Referring to FIG. 2, inductance wiring 5 which constitutes antenna section 4 is formed into a loop. Parts (a) and (b) in FIG. 2 show cross-sectional views taken along line P-Q for showing an example of the structure of inductance wiring 5, respectively.

Referring to part (a) in FIG. 2, inductance wiring 5 includes a metal wiring 6 which is formed as a conductive material and a magnetic film 7 which is formed on at least of surfaces of metal wiring 6. For example, magnetic thin film 7 is formed below metal wiring 6. Alternatively, referring to part (b) in FIG. 2, inductance wiring 5 includes metal wiring 6 and magnetic film 7 which is formed to correspond to the side surface portion and the lower surface portion of metal wiring 6. As can be seen, since the lower surface portion or the lower surface portion and the side surface portion of inductance wiring 5 are covered with magnetic film 7, it is possible to confine a magnetic flux generated by a current carried to metal wiring 6 by the shield of magnetic film 7. As a result, it is possible to increase the inductance value of inductance wiring 5.

As stated above, by forming the antenna section using the wiring the inductance of which is increased, it is possible to form an antenna securing a communication capability thereof even if the wiring length of the wiring is decreased, i.e., the number of turns of the loop is decreased. Consequently, it is possible to make an antenna section smaller in size while maintaining the same communication capability. As will be described later in detail, the manufacturing of a thin film magnetic memory device inevitably includes a step of manufacturing a magnetic film in memory array section 10. Therefore, by utilizing this manufacturing step, it is possible to manufacture an inductance wiring having a high inductance to be used as an antenna without adding a special, dedicated step to the inductance wiring.

Figure 17:
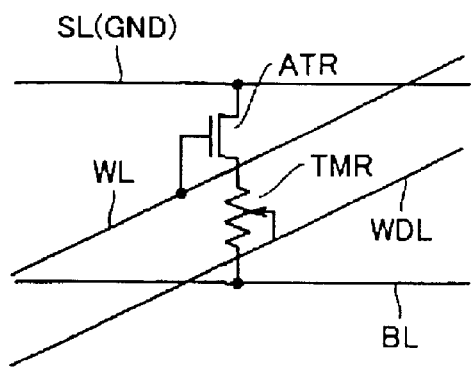
FIG. 17 is a conceptual view showing the configuration of an MTJ memory cell.
Figure 18:
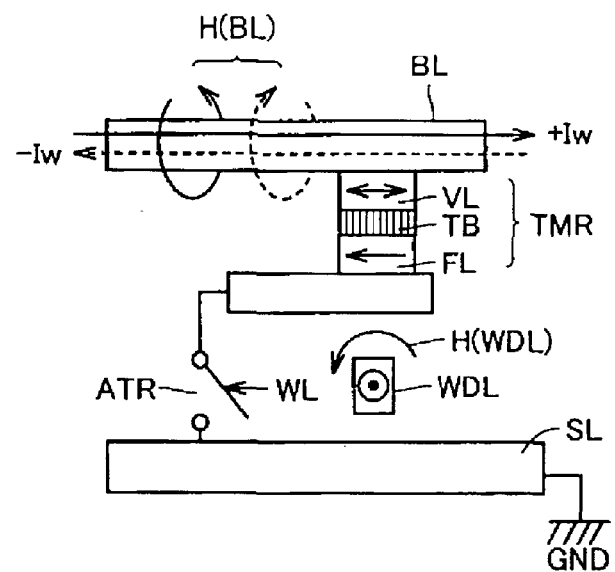
FIG. 18 is a conceptual view for explaining a data write operation for writing data to the MTJ memory cell.
Figure 19:
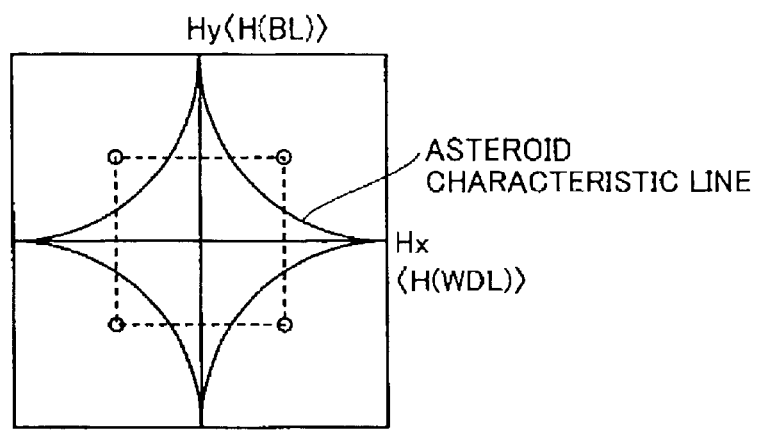
FIG. 19 is a conceptual view showing the relationship between a data write current and the magnetization state of the MTJ memory cell.
Figure 20:
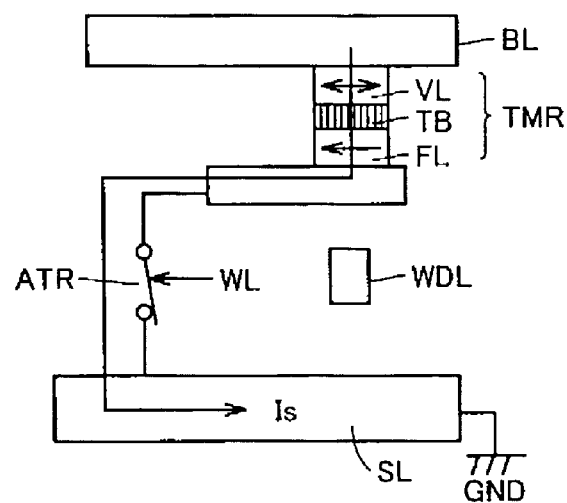
FIG. 20 is a conceptual view for explaining a data read operation for reading data from the MTJ memory cell.

Referring back to FIG. 1, MRAM section 2 includes memory array section 10 in which MTJ memory cells each having the same configuration as that shown in FIG. 17 are arranged in a matrix, a memory peripheral circuit section 11 for executing data read and write operations to memory array section 10.

Peripheral circuit section 3 includes a modulation-demodulation/security section 12, a transmission and receiving section 13 and a power supply control section 14. Power supply control section 14 generates the operating power supply voltage of thin film magnetic memory device 1A using an induced current generated on inductance wiring 5 by the radio wave received by antenna section 4 as a source, and controls the voltage level of memory 1A. Transmission and receiving section 13 transmits and receives an operation instruction to MRAM section 2 and data inputted and outputted to and from MRAM section 2 between memory 1A and the outside of memory 1A through antenna section 4.

Modulation-demodulation/security section 12 demodulates a signal received by transmission and receiving section 13 and modulates a signal transmitted by transmission and receiving section 13. In addition, modulation-demodulation/security section 12 executes a data processing for ensuring security to the signals transmitted and received by transmission and receiving section 12, and generates operation instructions to MRAM section 2. The operation instructions involve an instruction for indicating a command to be executed in MRAM section 2 and an address select instruction corresponding to an address signal. That is, each operation instruction to MRAM section 2 is executed based on an external instruction included in the signal demodulated by modulation-demodulation/security section 12.

FIG. 3 is a block diagram for explaining the configuration of peripheral circuit section 3 shown in FIG. 1 in detail.

Referring to FIG. 3, power supply control section 14 includes a power supply line 15, a rectifier 16, a reference generation circuit 17, a shunt regulator 18 and a power supply detection circuit 19. Power supply line 15 transmits an internal power supply voltage Vcc which serves as an operating power supply voltage to the internal circuit group of thin film magnetic memory device 1A. Rectifier 16 transforms an induced current generated on inductance wiring 5 which constitutes antenna section 4 into a direct current. Reference generation circuit 17 highly accurately generates a reference voltage Vpr based on a band gap using semiconductor bipolar action. Reference voltage Vpr is set at, for example, about 1.3V. Shunt regulator 18 generates internal power supply voltage Vcc based on reference voltage Vpr on power supply line 15 using the direct current transformed from the induced current by rectifier 16 as a source.

Power supply detection circuit 19 detects whether or not the voltage level of power supply line 15 reaches predetermined level. That is, if internal power supply voltage Vcc is not less than the predetermined level, the circuit operation of thin file magnetic memory 1A is ensured. Therefore, power supply detection circuit 10 generates a signal for permitting an ordinary internal circuit operation. On the other hand, if an external radio wave is stopped and internal power supply voltage Vcc with the induced current as a source becomes lower than the predetermined level, then power supply detection circuit 19 stops the ordinary internal circuit operation and generates a signal for indicating the protection of data in MRAM section 2.

Transmission and receiving section 13 includes a communication control circuit 20, a carrier extraction circuit 21 and a transmission circuit 22. Communication control circuit 20 controls the transmission and receiving of the radio wave to and from the outside of memory 1A through antenna section 4. Specifically, communication control section 20 mainly controls radio wave transmission and receiving timing. For example, communication control circuit 20 stops the transmission of the radio wave from antenna section 4 when a radio wave is received from the outside. In addition, when a radio wave is transmitted to the outside, communication control circuit 20 starts the transmission of the radio wave after being informed from the outside that a data receiving state is ready. Carrier extraction circuit 21 extracts a carrier signal Sc (having frequency fc) from the radio wave received by antenna section 4. Transmission circuit 22 transmits the radio wave to be transmitted to the outside, to antenna section 4.

Modulation-demodulation/security section 12 includes an oscillator 23, a synchronizing circuit 24, a data processing circuit 25, a demodulation circuit 26 and a modulation circuit 27.

Oscillator 23 generates a reference clock with a reference frequency fo. Synchronizing circuit 24 generates a clock signal CKc synchronized with carrier signal Sc based on the reference clock generated in, for example, a phased locked loop (PLL) by oscillator 23. Synchronized clock signal CKc is transmitted to demodulation circuit 26 and demodulation circuit 27.

Demodulation circuit 26 extracts a transmission signal including a written data string or an operation instruction string which is transmitted while being carried by carrier signal Sc from carrier signal Sc using clock signal CKc. The external transmission signal is carried by the carrier signal in an encrypted state. Data processing circuit 25 decodes the encrypted transmission signal, and conducts a processing for obtaining the external written data or operation instruction.

If the data read from MRAM section 2 is transmitted to the outside of thin film magnetic memory device 1A, data processing circuit 25 encrypts the read data to be transmitted and outputs the encrypted read data to modulation circuit 27. Modulation circuit 27 carries out a processing for carrying the encrypted read data from data processing circuit 25 on a carrier signal transmitted to the outside of memory 1A.

MRAM section 2 executes the input and output of data DAT in accordance with the external operation instruction demodulated by data processing circuit 25. It is noted that data DAT is the general term of the above-stated read data and written data. The configuration of MRAM section 2 will next be described.

Figure 4:
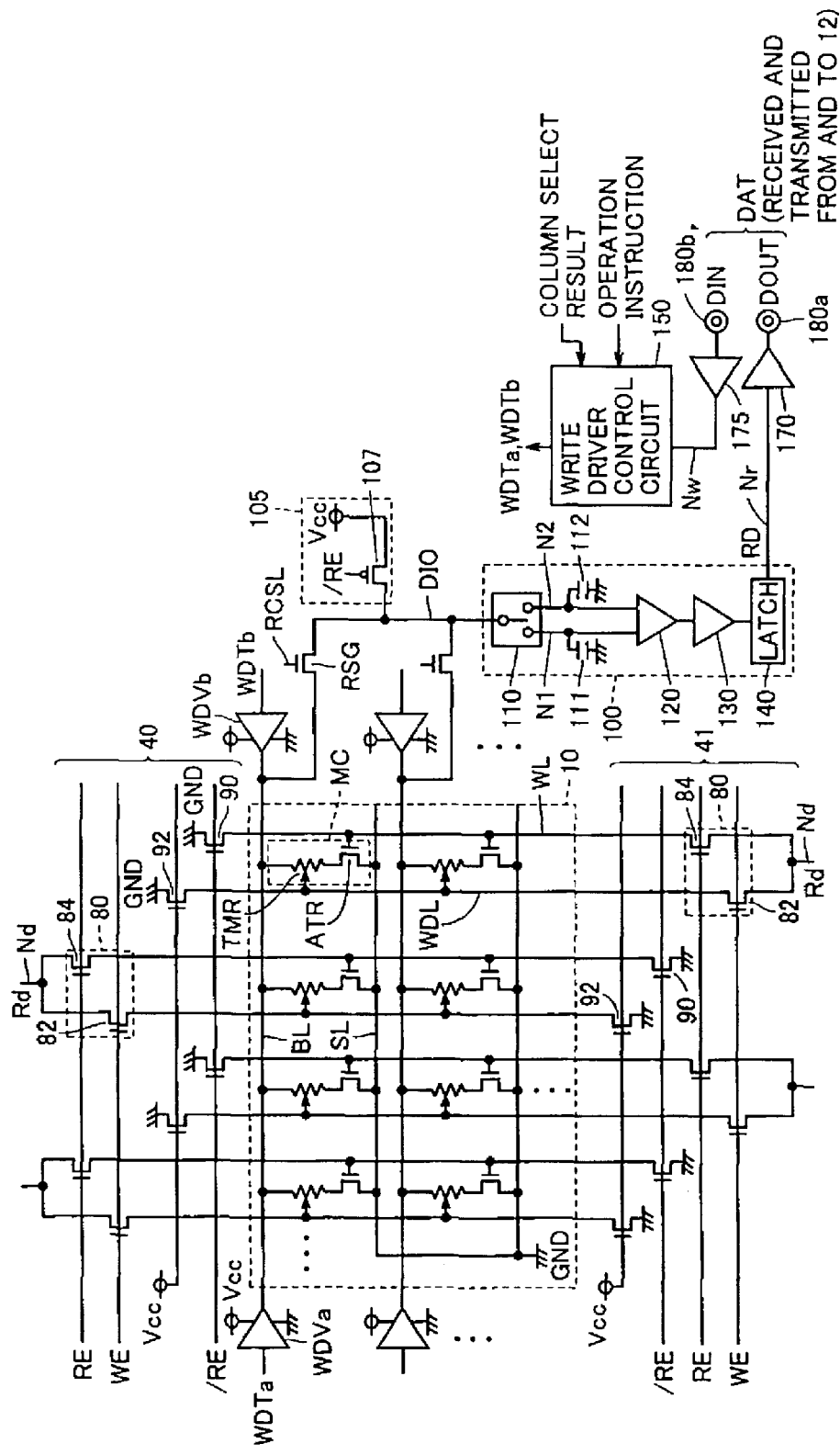
FIG. 4 is a circuit diagram for explaining the configuration of an MRAM section shown in FIG. 1.

FIG. 4 is a circuit diagram for explaining the configuration of MRAM section 2.

In FIG. 4, the configuration of memory array section 10 and those of main circuit sections of memory peripheral circuit section 11 employed for data read and write operations are typically shown.

Referring to FIG. 4, MTJ memory cells MC's are arranged in memory array section 10 in a matrix. Word line WL and write digit line WDL are arranged to correspond to each memory cell row, and bit line BL and source line SL are arranged to correspond to each memory cell column. Each MTJ memory cell MC has the same configuration as that described above with reference to FIG. 17, i.e., includes tunnel magneto-resistance element TMR and access transistor ATR which are connected between corresponding bit line BL and source line SL.

As already described, tunnel magneto-resistance element TMR has an electric resistance according to magnetization direction. That is, before data read, tunnel magneto-resistance element TMR of each MTJ memory cell is magnetized in a predetermined direction and the electric resistance of tunnel magneto-resistance element TMR is set at either Rmax or Rmin so as to store data at either H level ("1") or L level ("0").

Each source line SL is connected to ground voltage GND. The source voltage of each access transistor ATR is, therefore, fixed to ground voltage GND. As a result, in a selected row corresponding word line WL of which is activated to H level, tunnel magneto-resistance element TMR is connected to bit line BL while the voltage thereof is pulled down to ground voltage GND.

Next, the circuit configuration of row select circuits 40 and 41 for executing the selection of a row in memory array section 10 will be explained. Each of row select circuits 40 and 41 included in memory peripheral circuit section 11 shown in FIG. 1 includes a row driver 80 arranged per memory cell row. Row driver 80 controls the activation of corresponding word line WL and write digit line WDL based on a decoding signal Rd which indicates the result of decoding the corresponding memory cell row.

Decoding signal Rd is obtained by a decoding circuit which is not shown. If a corresponding memory cell row is selected, decoding signal Rd is set at H level (e.g., internal power supply voltage Vcc). Namely, a node Nd corresponding to the selected row is set at H level. Otherwise, node Nd is set at L level (e.g., ground voltage GND). In each of one data read operation and one data write operation, decoding signal Rd of each memory cell row is held at node Nd by a latch circuit which is not shown.

Row driver 80 includes a transistor switch 82 which is provided between node Nd and one end of write digit line WDL, and a transistor switch 84 which is provide between node Nd and one end of word line WL. A control signal WE which is activated to H level when data is written to MTJ memory cell MC, is applied to the gate of transistor switch 82. A control signal RE which is activated to H level when data is read from MTJ memory cell MC, is inputted into the gate of transistor switch 84.

Accordingly, when data is written to MTJ memory cell MC, transistor switch 82 is turned on and transistor switch 84 is turned off in each row driver 80. When data is read therefrom, transistor switch 84 is turned on and transistor switch 82 is turned off in each row driver 80.

Furthermore, at time other than data read including data write, a transistor switch 90 which connects the other end of word line WL to ground voltage GND and a transistor switch 92 which connects the other end of write digit switch WDL to ground voltage are arranged to correspond to each memory cell row. Transistor switches 90 and 92 are arranged to be opposed to each other with row driver 80 and memory array section 10 put therebetween.

Transistor switch 90 receives the inverted signal/RE of control signal RE at a gate thereof and electrically connected between word line WL and ground voltage GND. Transistor switch 90, which includes the gate connected to internal power supply voltage Vcc, is electrically connected between write digit line WDL and ground voltage GND. In the example of the configuration shown in FIG. 2, each of transistors 82, 84, 90 and 92 consists of an N channel MOS transistor.

During data write, transistor switch 82 is turned on in response to control signal WE, and activates corresponding write digit line WDL based on the voltage of node Nd, i.e., decoding signal Rd of the corresponding memory cell row. Since activated write digit line is connected to node Nd set at H level, a data write current Ip is applied to a direction from row driver 80 toward transistor switch 92 in an ON state.

During data read, transistor switch 90 disconnects corresponding word line WL from ground voltage GND. Further, transistor switch 84 is turned on in response to control signal RE and activates corresponding word line WL in accordance with the voltage of node Nd, i.e., decoding signal Rd of the corresponding memory cell row. Activated word line WL is connected to node Nd set at H level. In response to this, the node of access transistor ATR corresponding to the selected row is turned on and a magnetic tunnel junction MTJ is electrically connected between bit line BL and source line SL. In this way, a row select operation in memory array section 10 is executed.

The same configuration is provided to correspond to word line WL and write digit line WD in each memory cell row. As shown in FIG. 4, row drivers 80 are arranged in a staggered fashion. Namely, row drivers 80 are arranged alternately on one ends of word lines WL's and write digit lines WDL's and on the other ends thereof according to the rows. By so arranging, it is possible to efficiently arrange row drivers 80 with small areas.

Memory peripheral circuit 11 also includes a write driver control circuit 150, write drivers WDVa and WDVb arranged in each memory cell column, an input buffer 175 and a data input terminal 180b.

Written data DIN written to MRAM section 2 and outputted from modulation-demodulation/security section 12 is received by data input terminal 180b and transmitted to a node Nw through input buffer 175. Write driver control circuit 150 sets write control signals WDTa and WDTb for each memory cell column in accordance with the written data transmitted to node Nw and a column select result in response to an operation instruction.

In each memory cell column, write driver WDVa drives one end of corresponding bit line BL to either internal power supply voltage Vcc or ground voltage GND in accordance with corresponding write control signal WDTa. Likewise, write driver WDVb drives the other end of corresponding bit line BL to either internal power supply voltage Vcc or ground voltage GND in accordance with corresponding write control signal WDTb.

During data write, the levels of write control signals WDTa and WDTb corresponding to a selected column are set at H level and L level or L level and H level, respectively, in accordance with the level of written data DIN. For example, if data at H level ("1") is written, the level of write control signal WDTa is set at H level so as to carry a data write current +Iw in a direction from write driver WDVa to write driver WDVb. Conversely, if data at L level ("0") is written, the level of write control signal WDTb is set at H level so as to carry a data write current −Iw in a direction from write driver WDVb to write driver WDVa. In the following description, data write currents +Iw and −Iw in different directions will be also generally referred to as "data write current ±Iw". On the other hand, in an unselected column, the levels of write control signals WDTa and WDTb are both set at L level. In addition, in operations other than the data write operation, the levels of write control signals WDTa and WDTb are both set at L level.

Write data according to data write current ±Iw is magnetically written to tunnel magneto-resistance element TMR which corresponding write digit line WDL and bit line BL are applied with data write currents Ip and ±Iw, respectively. The same configuration is also provided to correspond to bit line BL in each memory cell column. With the configuration shown in FIG. 2, the driving voltages of write drivers WDVa and WDVb can be set at voltages other than ground voltage GND and internal power supply voltage Vcc.

A data read operation for reading data from memory array section 10 will next be explained. Memory peripheral circuit section 11 further includes a data line DIO which transmits a voltage in accordance with the electric resistance of a selected memory cell and a read select gate RSG provided between data line DIO and each bit line BL. A read column select line RCSL which indicates the selected state of the corresponding memory cell column is connected to the gate of read select gate RSG. Each read column select line RCSL is activated to H level if corresponding memory cell column is selected. The same configuration is provided to each memory cell column. Namely, data line DIO is shared among bit lines BL's on memory array section 11. By so arranging, a selected memory cell is electrically connected to data line DIO through bit line BL of a selected column and corresponding read select gate RSG when data is read.

Memory peripheral circuit section 11 further includes a data read circuit 100, a data read current supply circuit 105, an output buffer 170 and a data output terminal 180a. Data read current supply circuit 105 includes a current supply transistor 107 which is electrically connected between internal power supply voltage Vcc and data line DIO. Current supply transistor 107 consists of a P channel MOS transistor which receives a control signal /RE (activated to L level when data is read).

During data read, current supply transistor 107 connects data line DIO to internal power supply voltage Vcc to thereby generate data read current Is. Data read current Is passes through a path of data line DIO—read select gate RSG of a selected column—bit line BL of selected column—tunnel magneto-resistance element TMR of a selected memory cell—access transistor ATR—source line SL. As a result, a voltage in accordance with the electric resistance of the selected memory cell is generated on data line DIO. In FIG. 4, an example of the data read current supply circuit 105 of the simplest configuration is shown. It is also possible to constitute data read current supply circuit 105 out of a constant current supply circuit having a current mirror configuration or the like so as to supply data read current Is more accurately.

Data read circuit 100 includes a switch circuit 110 which is provided between data line DIO and nodes N1 and N2, voltage holding capacitors 111 and 112 which are provided to correspond to nodes N1 and N2, respectively, sense amplifiers 120 and 130 and a latch circuit 140.

In one data read operation, switch circuit 110 connects nodes N1 and N2 selected in an order to data line DIO one by one. Voltage holding capacitors 111 and 112 are provided to hold the voltages of nodes N1 and N2, respectively.

Sense amplifier 120 amplifies the voltage difference between nodes N1 and N2. Sense amplifier 130 in the second stage further amplifies the output of sense amplifier 120 and transmits the amplified output to latch circuit 140. Latch circuit 140 amplifies the output of sense amplifier 130 at predetermined timing to have full amplitude and outputs a read signal RD to a node Nr.

One data read operation consists of the first read operation which is executed in a state in which no bias current is carried to write digit line WDL and the second read operation which is executed in a state in which a bias current is carried to write digit line WDL in a selected column. In particular, when data is written, data write current Ip carried to write digit line WDL can be used as the bias current. In this case, there is no need to provide a new circuit which supplies a bias current during data read, so that circuit configuration can be simplified.

In the first read operation, data is read from a selected memory cell in a state in which no current is carried to corresponding write digit line WDL (i.e., I(WDL)=0). Switch circuit 110 connects data line DIO to node N1. By doing so, data line voltage in the first read operation can be held on node N1 by voltage holding capacitor 111.

Next, in the second read operation, data is read from the selected memory cell in a state in which a bias current is carried to write digit line WDL corresponding to the selected column (I(WDL)=Ip), i.e., in a state in which a predetermined bias magnetic field along the magnetization hard axis direction acts on the selected memory cell. In the second read operation, switch circuit 110 connects data line DIO to node N2. As a result, data line voltage in the second data read operation is transmitted to node N2 and held by voltage holding capacitor 112.

By acting such a bias magnetic field on the selected memory cell, the memory cell resistance Rcell of the selected memory cell changes from that before the data read operation with polarity according to the level of the stored data. As a result, the voltage of data line DIO in the second read operation rises or falls from the voltage in the first read operation.

Specifically, if stored data (e.g., "1") corresponding to electric resistance Rmax is stored in the selected memory cell, the data line voltage in the second read operation is higher than that in the first read operation. This is because a current carried to tunnel magneto-resistance element TMR increases as memory cell resistance Rcell becomes lower by the action of the bias magnetic field caused by digit line current I(WDL).

Inversely, if stored data (e.g., "0") corresponding to electric resistance Rmin is stored in the selected memory cell, the data line voltage in the second read operation is lower than that in the first read operation. This is because memory cell resistance Rcell becomes higher by the action of the bias magnetic field caused by digit line current.

Sense amplifier 120 compares the voltages held at nodes N1 and N2 with each other, i.e., the data line voltage in the first read operation with that in the second read operation. After executing the second read operation, the output of sense amplifier 130 which further amplifies the output of sense amplifier 120 is amplified and latched by latch circuit 140 and read signal RD is generated, whereby read signal RD has level according to the data stored in the selected memory cell. Output buffer 170 outputs read data DOUT in accordance with read signal RD to data output terminal 180*b*. Read data DOUT from MRAM section 2 is transmitted from data output terminal 180*b* to modulation-demodulation/security section 12.

As can be seen, according to the configuration shown in FIG. 4, in the data read operation, data can be read only by accessing the selected memory cell without using a reference cell. In other words, read data is generated based on voltage comparison executed by the same data read path including the same memory cell, the same bit line, the same data line, the same sense amplifier and the like. It is, therefore, possible to avoid the influence of offset or the like on the respective circuits constituting the data read path resulting from the manufacturing irregularity, and to improve the accuracy of the data read operation.

Alternatively, a reference cell (not shown) which has an intermediate electric resistance between electric resistances Rmax and Rmin of the MTJ memory cell can be arranged and a reference voltage generated based on the reference cell can be inputted to node N1 or N2. With such configuration, read signal RD is generated by comparing the voltage of data line DIO connected to the selected memory cell with the reference voltage based on the reference cell. In this case, it is possible to read data by accessing the selected memory cell once, so that the data read operation can be accelerated.

The arrangement of inductance wiring 5 in thin film magnetic memory device 1A and the manufacturing processes thereof will next be explained in detail.

Figure 5:
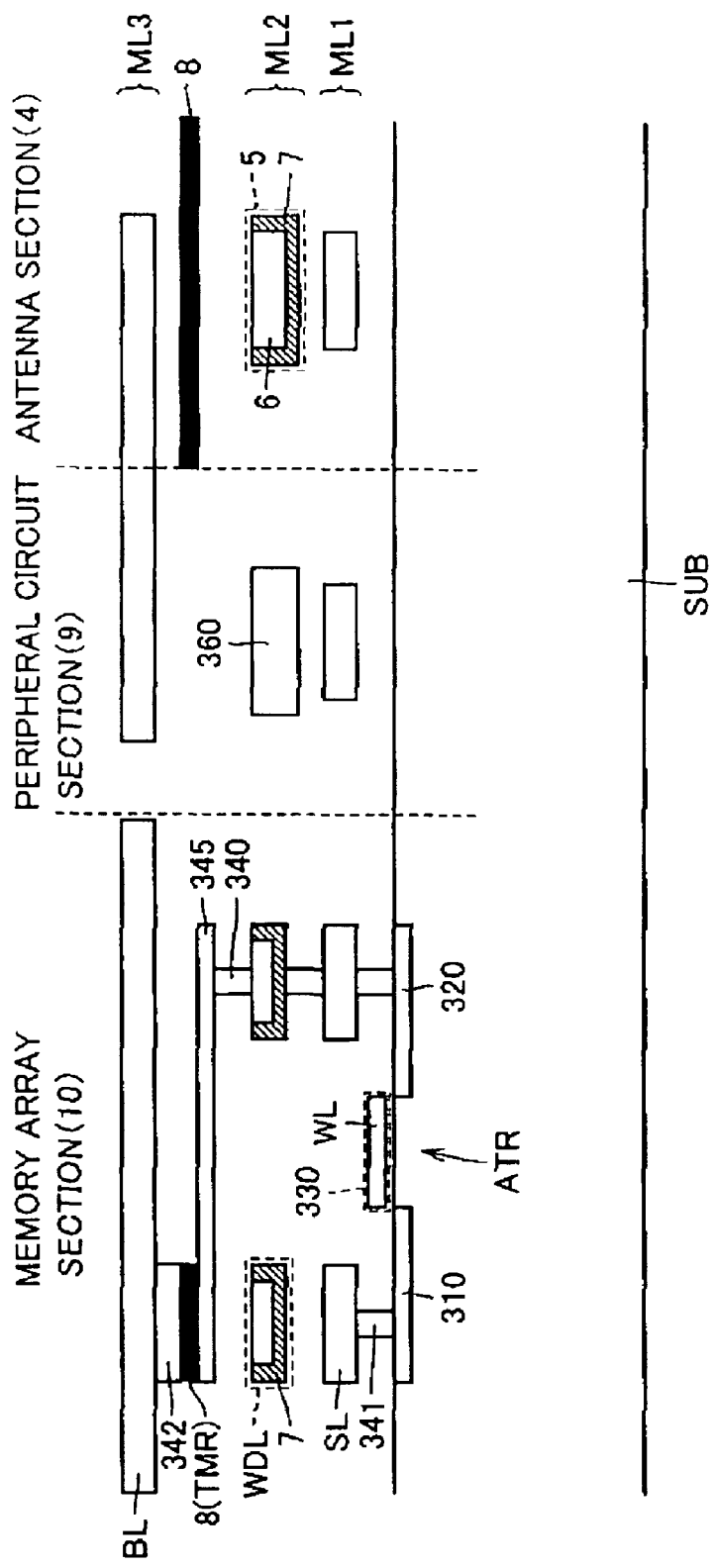
FIG. 5 is a cross-sectional view of a thin film magnetic memory device for showing the arrangement of the inductance wiring.

Referring to FIG. 5, thin film magnetic memory device 1A roughly consists of memory array section 10, peripheral circuit section 9 and antenna section 4. Memory peripheral circuit section 11 and peripheral circuit section 3 shown in FIG. 1 are generally denoted by peripheral circuit section 9.

Figure 21:
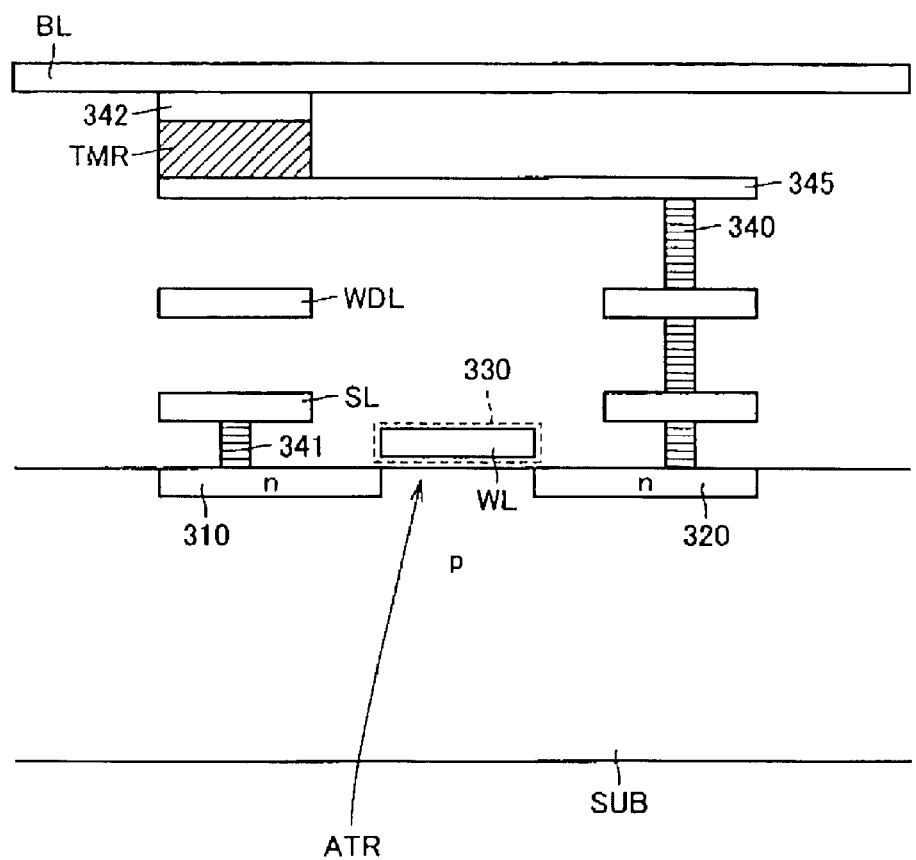
FIG. 21 is a structural view of an MTJ memory cell formed on a semiconductor substrate.
Figure 22:
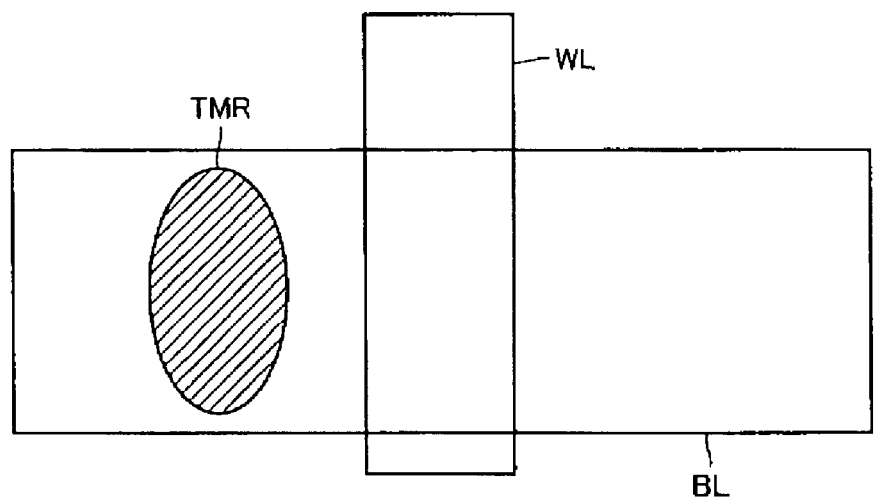
FIG. 22 is a top view of the MTJ memory cell having the structure shown in FIG. 21.

Thin film magnetic memory device 1A is formed on semiconductor substrate SUB. In memory array section 10, as in the case of the block diagram of FIG. 21, using metal wiring layers ML1, ML2 and ML3, source line SL, write digit line WDL and bit line BL are provided as signal lines for reading and writing data from and to an MTJ memory cell.

The lower surface and side surface portions of write digit line WDL arranged on metal wiring layer ML2 are covered with magnetic film 7 as in the case of the cross-sectional structure of inductance wiring 5 shown in part (b) in FIG. 2. This can increase the inductance value of write digit line WDL, so that it is possible to suppress the quantity of current necessary to generate necessary data write magnetic field and to reduce consumption power. Further, since the direction of a magnetic flux generated by write digit line WDL can be concentrated on a side just on write digit line WDL, it is possible to decrease the influence of the data write magnetic field on unselected adjacent memory cells. It is thereby possible to prevent erroneous data from being written and to improve the reliability of operation. Further, tunnel magneto-resistance element TMR is formed out of magnetic film 8. Since the structures of the other parts of memory array section 10 are the same as those of the block diagram shown in FIG. 21, they will not be repeatedly described herein.

Figure 6:
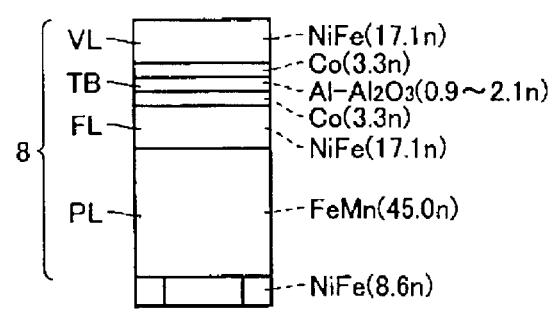
FIG. 6 is a conceptual view showing an example of the configuration of a magnetic film shown in FIG. 5.

Referring to FIG. 6, magnetic film 8 includes an NiFe film which forms free magnetic layer VL and an Al—$Al_2O_3$ film which is provided as tunneling barrier TB which is an insulating film for realizing a magnetic tunnel junction. The thickness of this Al—$Al_2O_3$ film is set at, for example, about 0.9 to 2.1 [nm($10^{-9}$ m)].

Magnetic film 8 also includes an NiFe film which is used as fixed magnetic layer FL, Co films which are formed between fixed magnetic layer FL and tunneling barrier TB and free magnetic layer VL and tunneling barrier TB, respectively, and an FeMn film which is provided as an antiferromagnetic film PL for fixing the magnetization direction of fixed magnetic layer FL. As already described, magnetic film 8 thus formed constitutes tunnel magneto-resistance element TMR for magnetically storing data in each memory cell. Namely, it is necessary to always form such magnetic film 8 in a thin film magnetic memory device.

Referring back to FIG. 5, in antenna section 4, inductance wiring 5 is formed on metal wiring layer ML2 on which write digit line WDL is formed. Inductance wiring 5 has a cross-sectional structure shown in part (b) of FIG. 2. As in the case of write digit line WDL, inductance wiring 5 includes magnetic film 7 formed to cover the lower surface and side surface portions of metal wiring 6. The inductance value of inductance wiring 5 is thereby increased.

Further, in antenna section 4, magnetic film 8 is formed on the upper layer of inductance wiring 5 as in the case of memory array section 10. While magnetic film 8 formed in memory array section 10 is micro-machined in accordance with the shape of each memory cell, magnetic film formed in antenna section 4 is provided to increase the inductance value of inductance wiring 5. Therefore, it is unnecessary to micro-machine magnetic film 8 formed in antenna section 4. Due to this, it suffices that magnetic film 8 may be formed flat in accordance with the shape of antenna section 4 in antenna section 4.

In peripheral circuit section 9, by contrast, magnetic film 7 is not formed on a metal wiring 360 which is arranged on metal wiring layer ML2 on which write digit line WDL and inductance wiring 5 are formed so as not to cause signal propagation delay on the signal wirings. Further, magnetic film 8 is not formed in peripheral circuit section 9, either. As a result, it is possible to suppress the inductance value of metal wiring 360 formed in peripheral circuit section 9 and to decrease signal propagation delay.

The manufacturing processes of manufacturing the thin film magnetic memory device having the structure shown in FIG. 5 will next be explained with reference to FIGS. 7 to 9.

Figure 7:
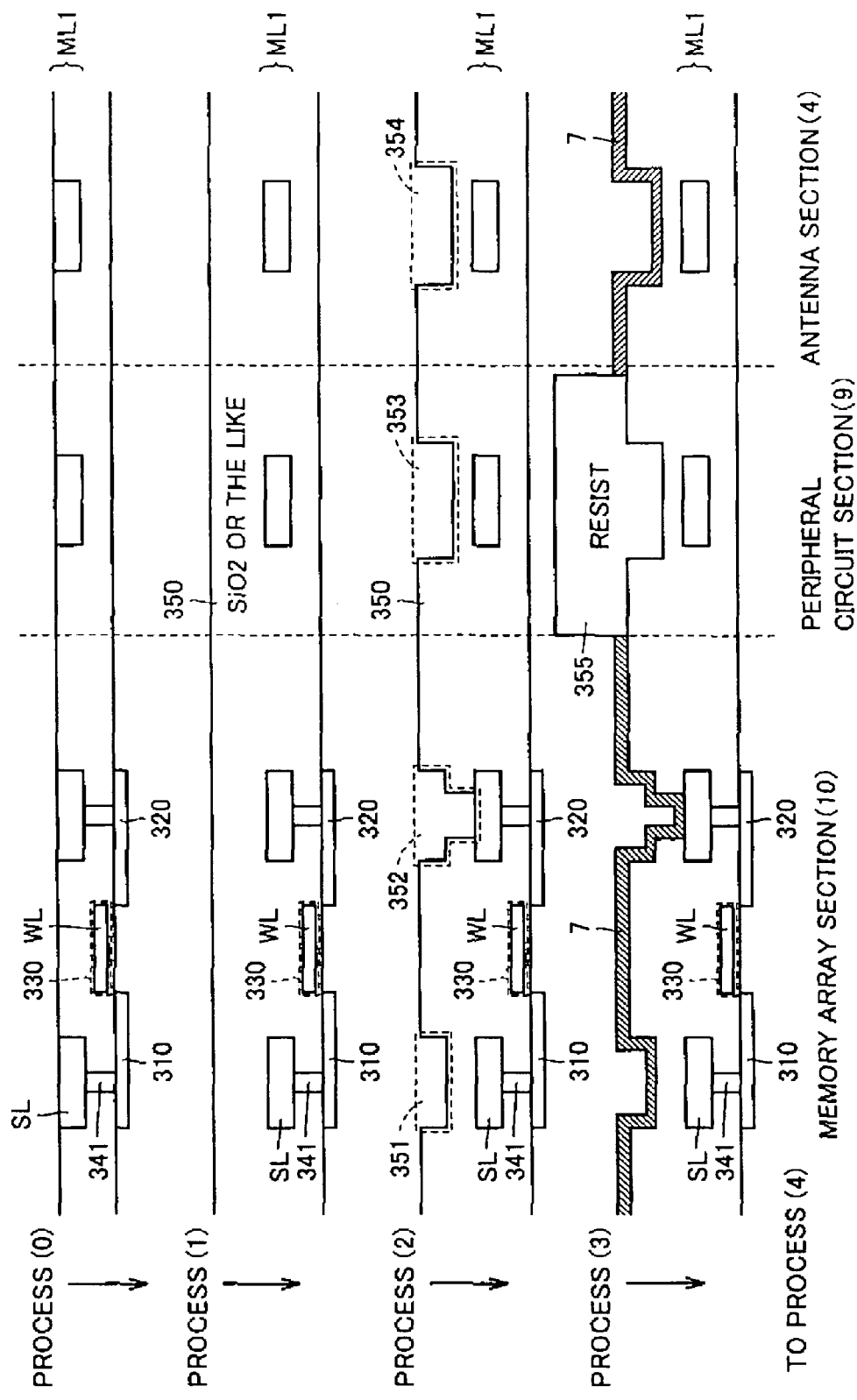
FIGS. 7 to 9 are first to third cross-sectional views for explaining the manufacturing processes of the thin film magnetic memory device shown in FIG. 5, respectively.

Referring to FIG. 7, a process (0) corresponds to time when the formation of metal wiring layer ML1 on which source line SL is arranged is finished. In a process (1), as preparation for forming metal wiring layer ML2, an interlayer insulating film 350 formed out of $SiO_2$ or the like is provided on metal wiring ML1.

In a process (2), dual damascene processing is conducted to a region 351 in which write digit line WDL is arranged, a region 352 for securing the contact between tunnel magneto-resistance element TMR and access transistor ATR, a region 353 for forming signal wiring 360 and a region 354 for forming inductance wiring 5.

In a process (3), magnetic film 7 is formed. Normally, magnetic film 7 is formed as a film of a plurality of layers each consisting of a magnetic body, TiN and the like. Magnetic film 7 is formed by sputtering or CVD (Chemical Vapor Deposition). Prior to process (3), a resist 355 is formed to correspond to peripheral circuit section 9. As a result, a region in which resist 355 is formed is protected and magnetic film 7 is not formed in this region. After process (3), resist 355 is removed by ashing or the like.

Figure 8:
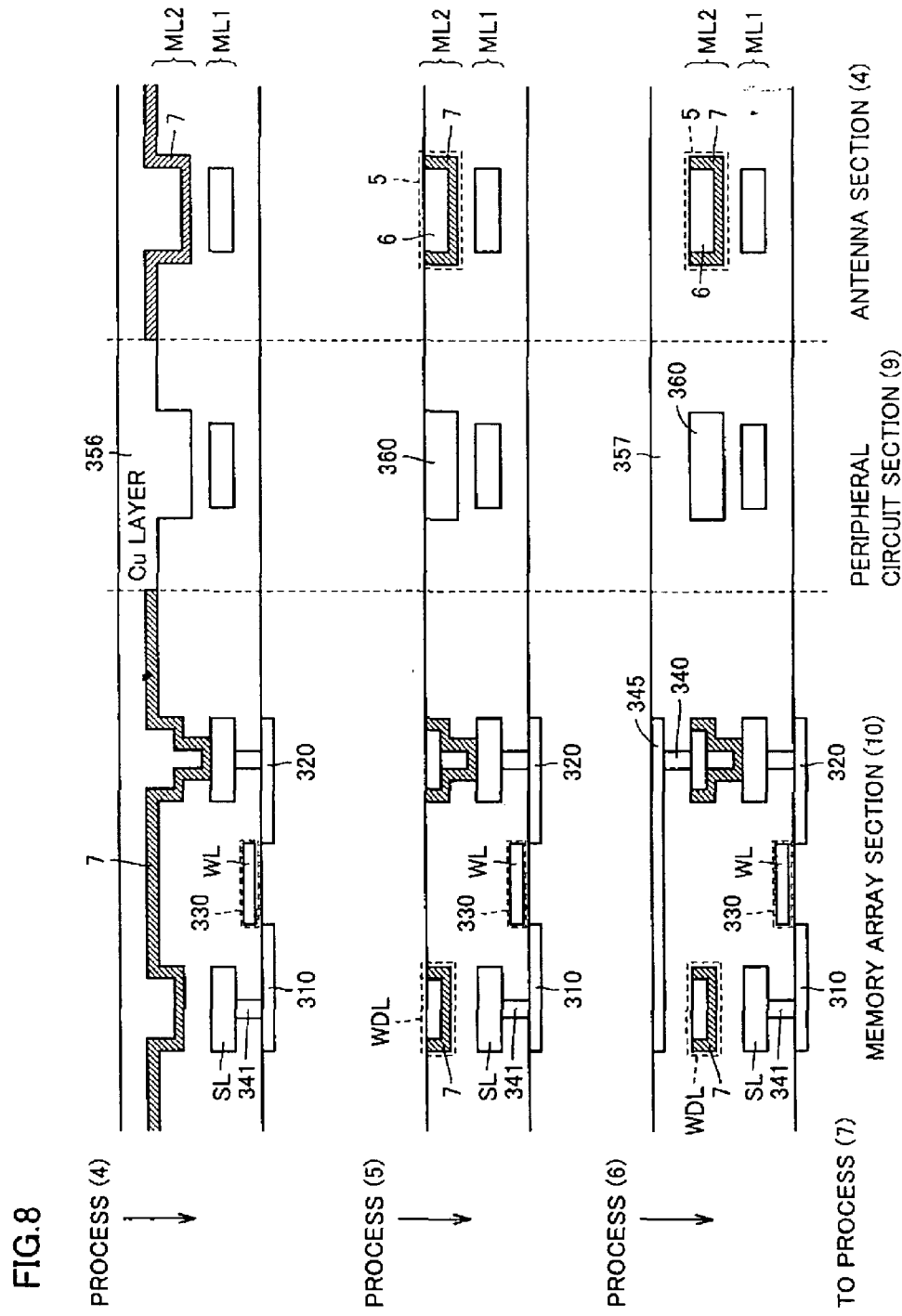

Referring to FIG. 8, in a process (4), a Cu-layer 356, for example, for forming metal wirings is further formed on the upper layer of magnetic film 7. Cu-layer 356 is embedded into the damascene regions by plating to thereby form the metal wirings. Next, in a process (5), Cu-layer 356 and magnetic film 7 are polished by, for example, CMP (Chemical Mechanical Polishing) to thereby conduct the flattening, the processing of the shapes and the like of a wiring group formed on metal wiring layer ML2. As a result, on metal wiring layer ML2, write digit line WDL is formed in memory array section 10, signal wiring 360 is formed in peripheral circuit section 9 and inductance wiring 5 is formed in antenna section 4.

In a process (6), in memory array section 10, contact hole 340 and strap 345 are formed so as to ensure the electrical connection between tunnel magneto-resistance element TMR and access transistor ATR. In peripheral circuit section 9 and antenna section 4, an interlayer insulating film ($SiO_2$ or the like) 357 is formed on metal wiring layer ML2.

Figure 9:
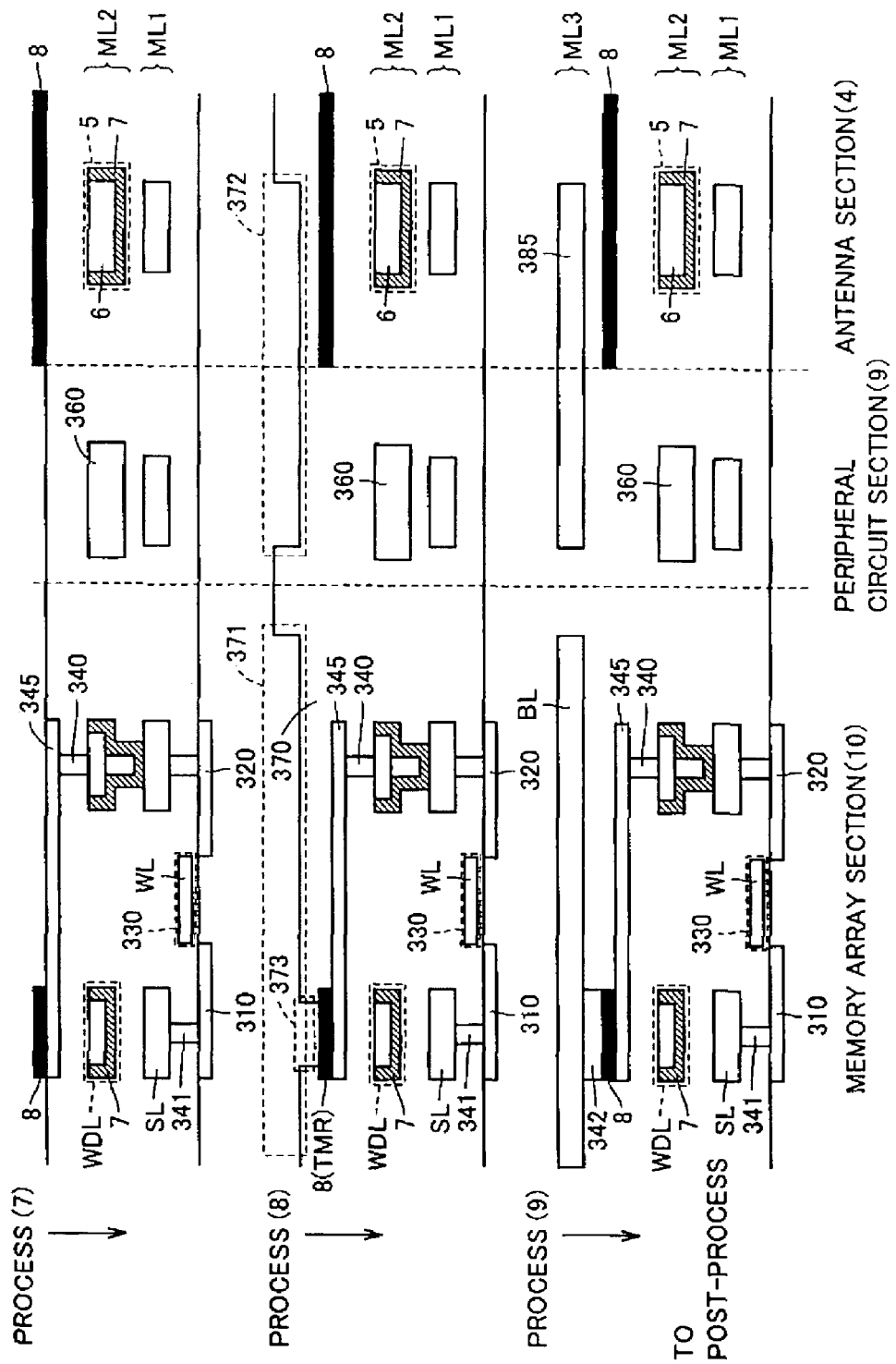

Referring to FIG. 9, in the next process (7), magnetic film 8 corresponding to tunnel magneto-resistance element TMR is formed and patterned by RIE (Reactive Ion Etching) or the like. As a result, magnetic film 8 in memory array section 10 is micro-machined in accordance with the shape of each memory cell. In antenna section 4, by contrast, magnetic film 8 is formed flat. In the next process (8), a region 371 for providing an upper layer of interlayer insulating film 370 formed on magnetic film 8 and a region 373 for securing the contact between the upper wiring and tunnel magneto-resistance element TMR are subjected to damascene processing.

Further, in a process (9), a Cu-layer or the like is formed as a metal wiring in the damascene regions by plating and then processed by CMP, thereby forming metal wiring layer ML3. As a result, bit line BL is formed to correspond to memory array section 10, and a metal wiring 385 is formed in antenna section 4 and peripheral circuit section 9.

Through these processes, the thin film magnetic memory device according to the first embodiment can be formed on the semiconductor substrate without the need to specially provide a dedicated step for increasing the inductance value of inductance layer 5. That is, by mounting an antenna formed by a wiring the inductance value of which is increased, it is possible to manufacture a small-sized, thin radio chip having high communication capability without causing the complication of manufacturing processes. In addition, since the thin film magnetic memory device can operate with low consumption power without requiring high voltage unlike EEPROM or the like, operating power can be sufficiently supplied from an external radio wave to the radio chip employing the thin film magnetic memory device. Due to this, it is also possible to repeatedly, semipermanently use the radio chip without the need to consider the service life of a battery.

First Modification of First Embodiment

Figure 10:
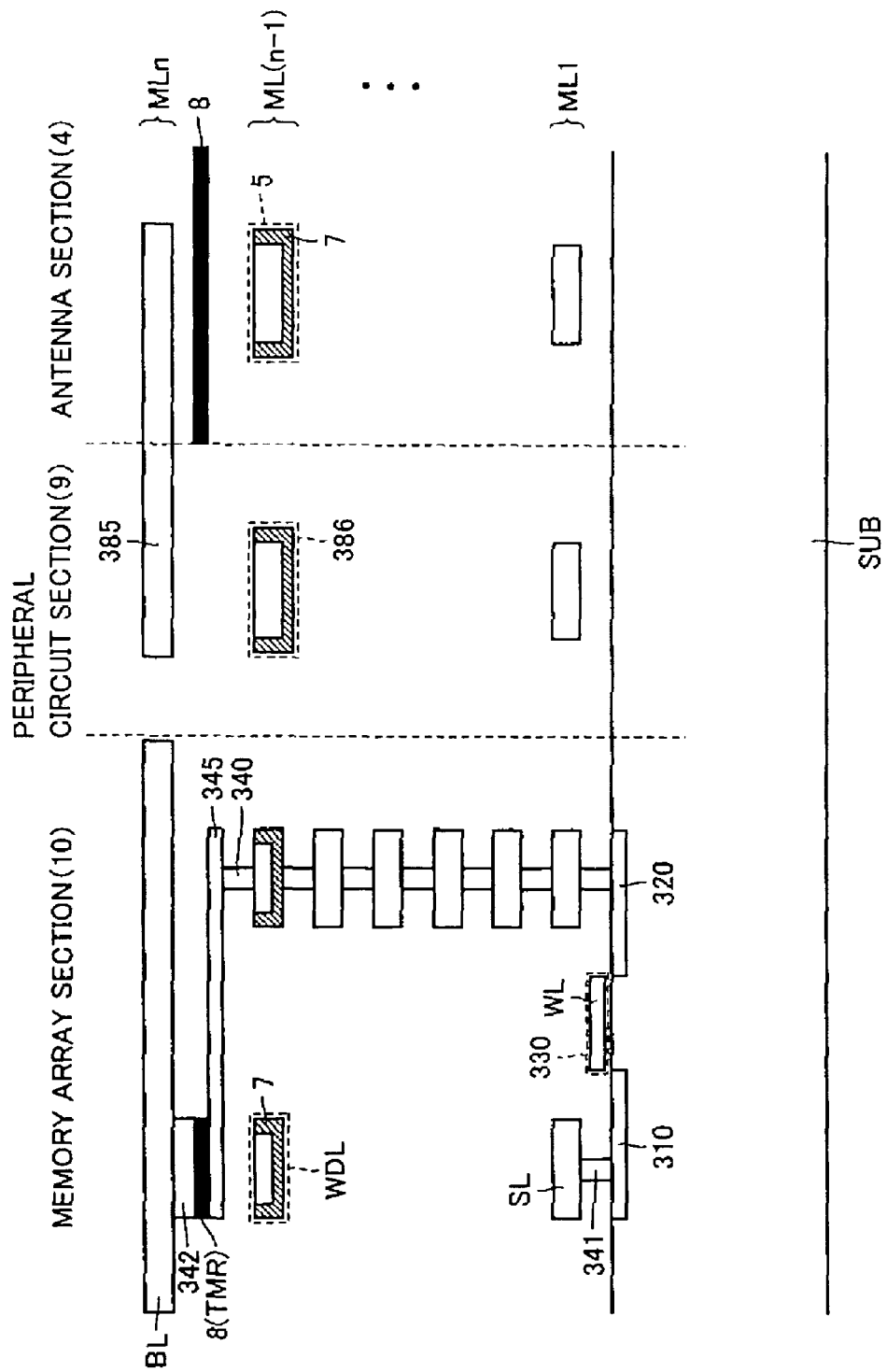
FIG. 10 is a cross-sectional view for explaining the structure of a thin film magnetic memory device according to the first modification of the first embodiment.

Referring to FIG. 10, in a thin film magnetic memory device according to the first modification of the first embodiment, tunnel magneto-resistance element TMR which constitutes a memory cell is provided between the uppermost metal wiring MLn and a metal wiring ML(n-1) below MLn. Namely, write digit line WDL and inductance wiring 5 is provided on metal wiring layer ML(n-1). In memory array section 10, bit line BL is provided on uppermost metal wiring MLn.

Normally, in peripheral circuit section 9 and antenna section 4, metal wiring ML(n-1) and the metal wiring such as MLn provided on the uppermost layer portion are used as power supply lines (typically power supply line 15 shown in FIG. 3) to which no signal propagation delay occurs. In the thin film magnetic memory device according to the first modification of the first embodiment, therefore, the lower surface portion or the lower surface and side surface portions of a signal line 386 provided on metal wiring layer ML(n-1) on which write digit line WDL and inductance line 5 are provided can be covered with magnetic film 7. As a result, prior to the step of forming metal wiring layer ML(n-1) which corresponds to the intermediate between processes (2) and (3) shown in FIG. 7, it is unnecessary to form resist 355 in a region corresponding to peripheral circuit section 9, so that manufacturing processes can be simplified.

Second Modification of First Embodiment

Figure 11:
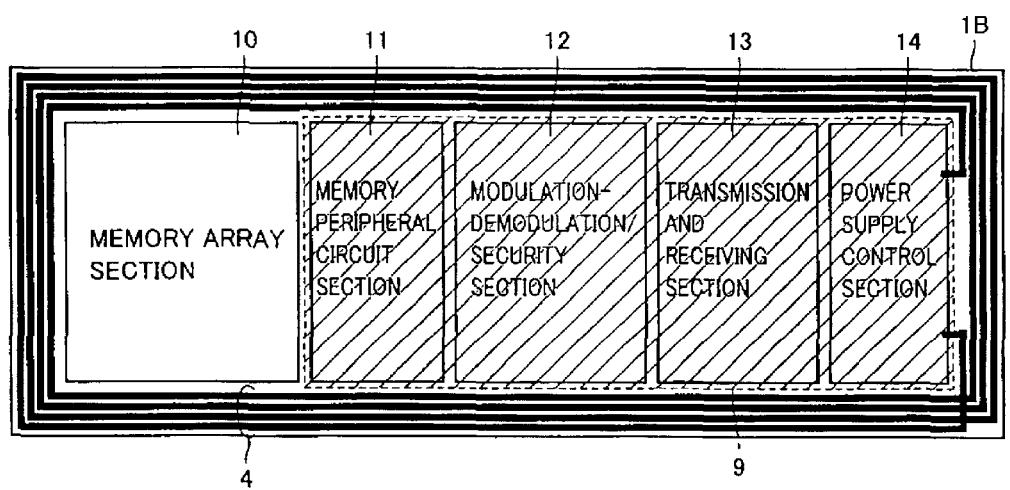
FIG. 11 is a schematic block diagram showing the overall configuration of a thin film magnetic memory device according to the second modification of the first embodiment.

Referring to FIG. 11, a thin film magnetic memory device 1B according to the second modification of the first embodiment, includes memory array section 10, memory array peripheral circuit section 11, modulation-demodulation/security section 12, transmission and receiving section 13, power supply control section 14 and antenna section 4 as in the case of thin film magnetic memory device 1A shown in FIG. 1. As described with reference to FIG. 5, in thin film magnetic memory device 1A according to the first embodiment, magnetic film 8 corresponding to tunnel magneto-resistance element TMR is arranged in a region corresponding to antenna section 4 but not arranged in a region corresponding to peripheral circuit section 9.

In thin film magnetic memory device 1B according to the second modification of the first embodiment, by contrast, magnetic film 8 is formed on a plane surface in overall peripheral circuit section 9 which consists of memory peripheral circuit section 11, modulation-demodulation/security section 12, transmission and receiving section 13 and power supply control section 14.

Figure 12:
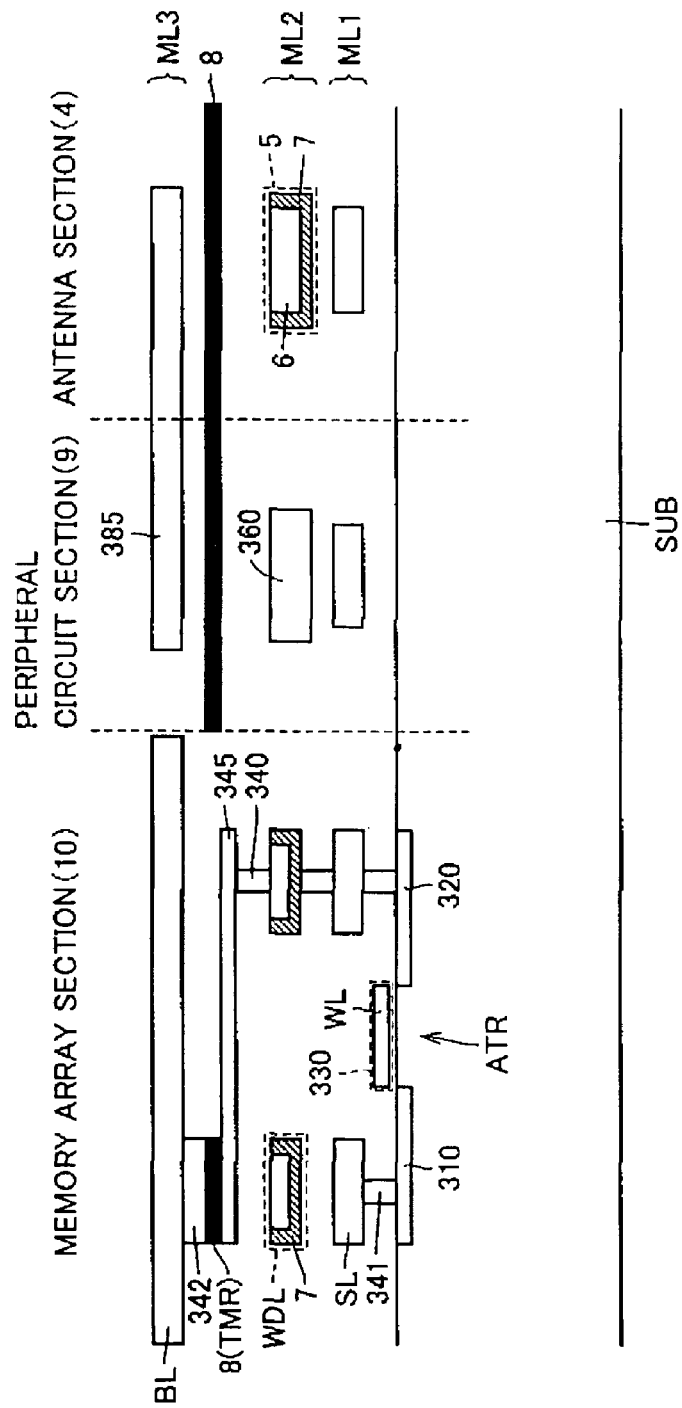
FIG. 12 is a cross-sectional view of the thin film magnetic memory device according to the second modification of the first embodiment.

FIG. 12 is a cross-sectional view of thin film magnetic memory device 1B shown in FIG. 11.

As can be understood from the comparison of the cross-sectional view of the thin film magnetic memory device shown in FIG. 12 with that according to the first embodiment, the configuration according to the second modification of the first embodiment differs from that according to the first embodiment in that magnetic film 8 is also formed in peripheral circuit section 9. Namely, in the manufacturing steps of manufacturing the thin film magnetic memory device according to the second modification of the first embodiment, the magnetic film is micro-machined in accordance with the shape of each memory cell and used as tunnel magneto-resistance element TMR in memory array section 10 and magnetic thin film 8 is formed flat in both of peripheral circuit section 9 and antenna section 4 in the manufacturing step corresponding to process (7) shown in FIG. 9.

By so constituting, it is possible to further improve the inductance value of inductance wiring 5 which is formed into a loop and constitutes antenna section 4. As a result, the communication capability of antenna section 4 can be improved. In other words, since the number of turns of inductance wiring 5 necessary to obtain the same communication capability can be decreased, it is possible to make the thin film magnetic memory device used as a radio chip further smaller in size.

Second Embodiment

In the second embodiment, the configuration of a distribution management system which employs the thin film magnetic memory device according to the first embodiment or one of the modifications thereof will be described.

Figure 13:
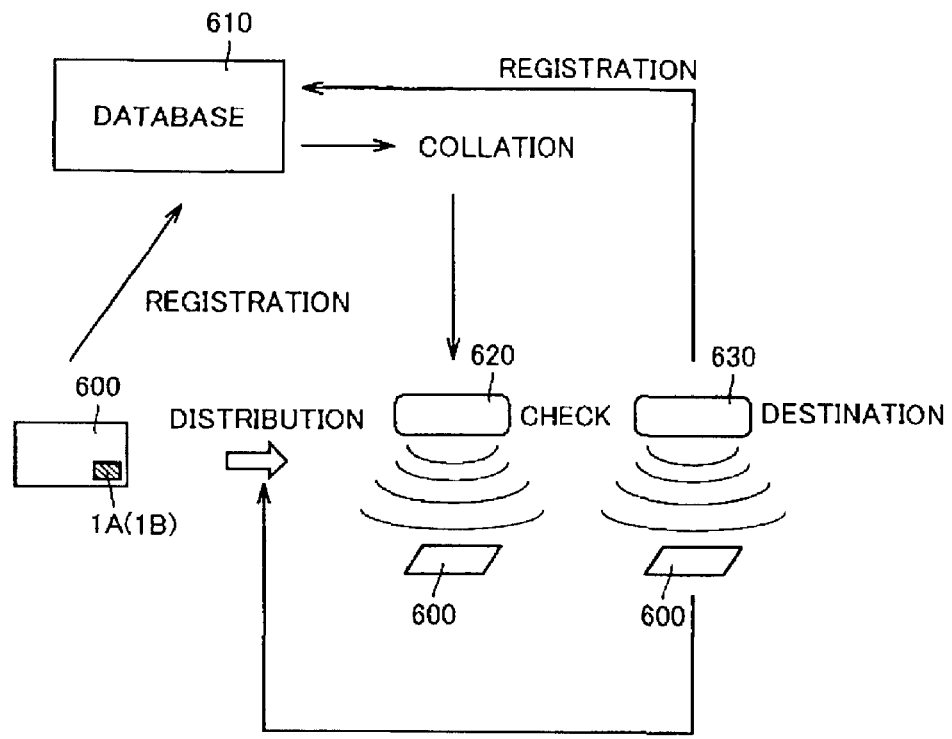
FIG. 13 is a conceptual view for explaining the configuration of a distribution management system according to the second embodiment.

Referring to FIG. 13, the distribution management system according to the second embodiment includes a distributed article 600 into which thin film magnetic memory device 1A (1B) according to the first embodiment or one of the modifications thereof is integrally embedded, a database 610, a data read device 620 and a data write device 630.

In distributed article 600, thin film magnetic memory device 1A or 1B used as a radio chip is provided as a non-contact type tag chip. In the second embodiment, thin film magnetic memory device 1A or 1B will be also simply referred as "a tag chip 1A (1B)". Tag chip 1A (1B) stores management data on distributed article 600 in a nonvolatile manner. The management data includes data on the manufacturing, sales, maintenance and the like of the distributed article.

By employing the thin film magnetic memory device in which the antenna section can be made small in size according to the first embodiment or one of the medications thereof as a tag chip, in particular, it is possible to expand a distributed article application range. For example, it is possible to embed a non-contact type tag chip even into a paper distributed article such as securities. Further, a tag chip can be attached to the clearance between a pedestal and a stone for a distributed article such as a ring. A tag chip can be attached to a chain portion which connects stones for a distributed article such as a necklace.

Figure 14:
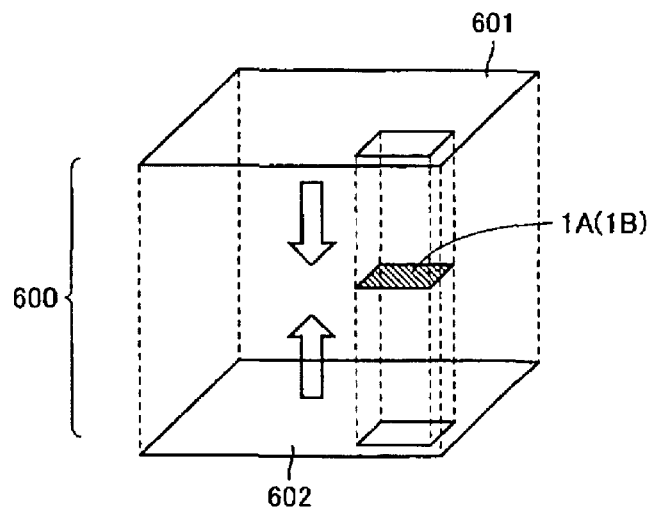
FIG. 14 is a conceptual view for explaining a method of embedding a tag chip into a paper distributed article.

FIG. 14 is a conceptual view for explaining a method of embedding a tag chip into a paper distributed article.

Referring to FIG. 14, a tag chip 1A (1B) according to the first embodiment of the present invention for which a film can be made thinner is embedded into paper distributed article 600 so as to bond tag chip 1A (1B) between a cover and a back cover 602. It is thereby possible to integrally embed the non-contact type tag chip into paper distributed article 600.

Referring back to FIG. 13, database 610 registers and collates the management data. Data read device 620 reads the management data on distributed article 600 into which the tag chip is embedded by a radio wave transmitted and received through an antenna formed on tag chip 1A (1B) in a non-contact manner. The management data read by data read device 620 can be collated by database 610.

Data write device 630 writes the management data on distributed article 600 to tag chip 1A (1B) by a radio wave transmitted and received through the antenna formed on tag chip 1A (1B) in a non-contact manner. The management data written by data write device 630 is registered in database 610.

By so constituting, it is possible to provide the management data registered in the database to a distribution path after the management data is written by data write device 630 for distributed article 600 before, for example, distribution. As a result, it is possible to collate the management data using data reading device 620 in an arbitrary stage of the distribution path. If data write device 630 is employed in the course of the distribution on need, it is possible to correct the management data while reflecting a change in the course of the distribution on the management data.

Further, if distributed article 600 is repeatedly distributed, new management data may be written to tag chip 1A (1B) by data write device 630 and registered in database 610 and then provided again to the distribution path.

By constituting the distribution management system employing the thin film magnetic memory device which includes an antenna made small in size as a tag chip, it is possible to expand a distributed article range the distribution of which can be managed by transmitting and receiving management data in a non-contact manner. In addition, since tag chip operating power can be sufficiently supplied by the external radio wave, it is also possible to semipermanently use the tag chip without considering the service life of a battery.

Third Embodiment

In the third embodiment, the configuration of a manufacturing process management system which employs the thin film magnetic memory device shown in the first embodiment or one of the modifications thereof as an ID (Identification) chip will be described.

Figure 15:
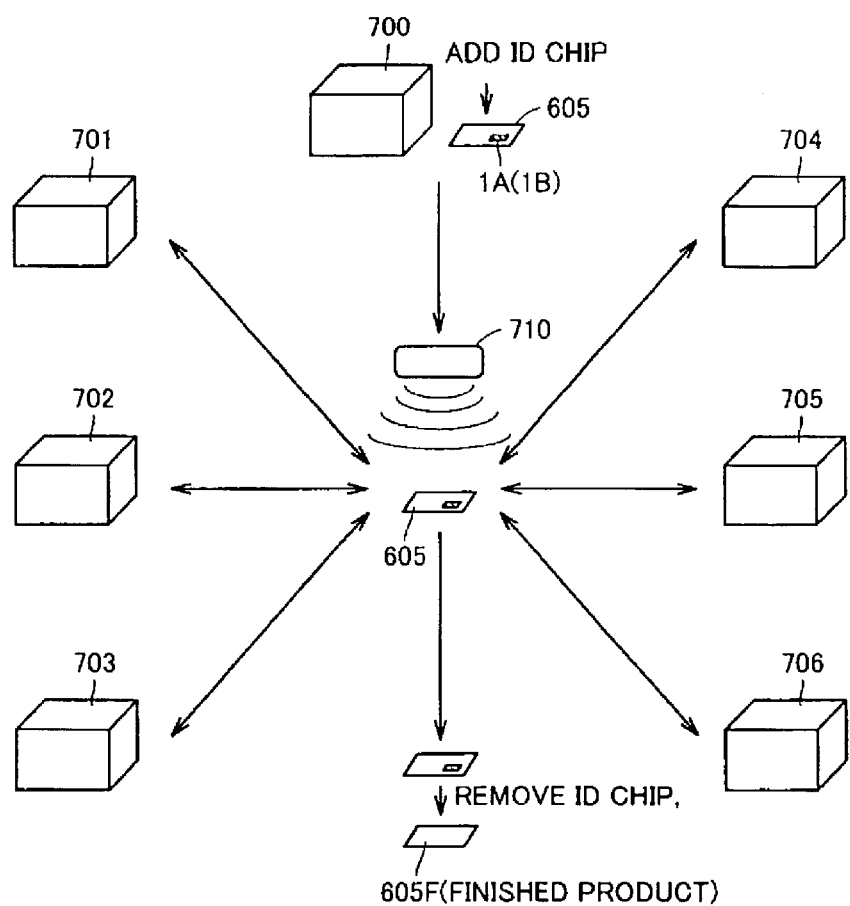
FIG. 15 is a conceptual view for explaining the configuration of a manufacturing process management system according to the third embodiment.

Referring to FIG. 15, the manufacturing process management system according to the third embodiment includes a semifinished article 605 to which thin film magnetic memory device 1A (1B) according to the first embodiment or one of the modifications thereof is added, a plurality of manufacturing processes 700 to 706 to which semifinished article 605 is subjected, and a process management device 710.

Thin film magnetic memory device 1A or 1B employed as a radio chip is added to semifinished article 605 which is subjected to the manufacturing processes as a non-contact type ID chip for storing process management data on the semifinished article. In the third embodiment, thin film magnetic memory device 1A (1B) added to semifinished article 605 will be also simply referred as "ID chip 1A (1B)".

Process management device 710 transmits and receives step management data to and from ID chip 1A (1B). As already described in the first embodiment and the modifications thereof, the transmission and receiving of data between process management device 710 and ID chip 1A (1B) is executed based on a radio wave transmitted and received through the antenna section constituted out of the inductance wiring formed on the ID chip. Semifinished article 605 is subjected to manufacturing processes 700 to 706 in a predetermined order. After being subjected to all the manufacturing processes, ID chip 1A (1B) is removed from semifinished article 605 and semifinished article 605 is made a finished article 605F and shipped.

Figure 16:
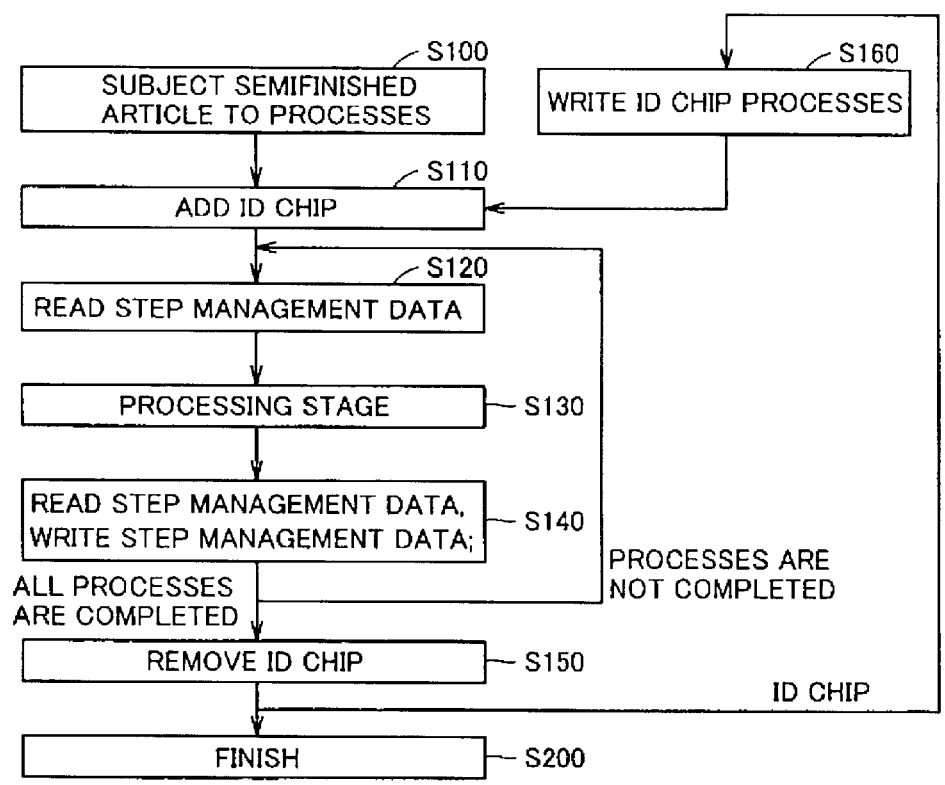
FIG. 16 is a flow chart for explaining a manufacturing process management method according to the third embodiment.

FIG. 16 is a flow chart for explaining a manufacturing process management method according to the third embodiment.

Referring to FIG. 16, when a semifinished article is inputted into the processes (in a step S100), an ID chip which stores process management data in a nonvolatile manner is added (in a step S110). The process management data stored in the ID chip involve the order of manufacturing processes through which the semifinished article into which the ID chip is embedded, the track record of the semifinished article which is subjected to the respective manufacturing processes and the like.

If semifinished article 605 is transmitted to one of manufacturing processes 700 to 706 shown in FIG. 15, process management device 710 reads the process management data by a data read operation for reading data from ID chip 1A(1B) added to semifinished article 605 (in a step S120). It is possible to determine whether or not the semifinished article can be correctly transmitted to the manufacturing process based on the read process management data. If the semifinished article can be correctly transmitted to the manufacturing process based on the read process management data, a processing stage in the manufacturing process is executed to the semifinished article.

After the completion of the processing stage, information indicating at least that the semifinished article has been subjected to the manufacturing process is written to ID chip 1A (1B). At this moment, manufacturing track record of the manufacturing process and the like can be also written to ID chip 1A (1B). Further, by reading the process management data from ID chip 1A (1B), it is determined whether or not the semifinished article has been completed with all the predetermined manufacturing processes (in a step S140). If a manufacturing process to which the semifinished article should be subjected remains, i.e., all the manufacturing processes are not finished, then the semifinished article is transmitted to the remaining manufacturing process and the processings in steps S120 to S140 are executed again to the semifinished article. If all the manufacturing processes are completed, by contrast, the ID chip is removed from the semifinished article (in a step S150). As a result, the semifinished article is turned into a finished article and the manufacturing processes are finished (in a step S200). By registering again process management data in ID chip 1A (1B) removed from the semifinished article, ID chip 1A(1B) can be added again to another semifinished article (in a step S160).

With the above-stated configuration, by employing the thin film magnetic memory device which is a nonvolatile memory having a radio communication capability and capable of programming data as an ID chip, it is possible to constitute a process management system employing a non-contact type ID chip which is made small in size and the consumption power of which is reduced. The ID chip which employs the thin film magnetic memory device according to the first embodiment or one of the modifications thereof, in particular, can be made thin and small in size. Therefore, the ID chip can be applied to a small-sized or thin article manufacturing process management system. Further, since operating power for the ID chip can be sufficiently supplied by an external radio wave, it is possible to semipermanently, repeatedly use the ID chip without the need to consider the service life of the ID chip.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thin film magnetic memory device formed on a substrate, comprising:
   a conductive wiring formed on said substrate;
   a first magnetic film selectively formed on at least one of surfaces of said conductive wiring on said substrate to correspond to at least a portion right under said conductive wiring; and
   a plurality of magnetic memory cells each having a second magnetic film for magnetically holding stored data, wherein
   said second magnetic film is also formed on an upper layer of said conductive wiring in a process of forming said plurality of magnetic memory cells.

2. The thin film magnetic memory device according to claim 1, wherein
   said first magnetic film is further formed to correspond to a side surface portion of said conductive wiring.

3. The thin film magnetic memory device according to claim 1, wherein
   said conductive wiring is formed into a loop.

4. A thin film magnetic memory device formed on a substrate, comprising:
   a conductive wiring formed on said substrate;
   a first magnetic film selectively formed on at least one of surfaces of said conductive wiring on said substrate to correspond to at least a portion right under said conductive wiring;
   a memory array section having a plurality of magnetic memory cells each having a second magnetic film for magnetically holding stored data, arranged therein;
   an array peripheral circuit section for reading and writing said stored data from and to said memory array section;
   an antenna section constituted out of said conductive wiring formed into the loop; and a peripheral circuit section for generating an operation instruction to said peripheral circuit section based on a radio wave received by said antenna section.

5. The thin film magnetic memory device according to claim 4, wherein said peripheral circuit section includes a transmission and receiving section provided between said antenna section and said array peripheral circuit section, and transmitting and receiving the stored data read from said memory array section and the stored data written to said memory array section to and from an outside of the thin film magnetic memory device.

6. The thin film magnetic memory device according to claim 4, wherein said peripheral circuit section includes a power supply control section generating an operating power supply voltage of said thin film magnetic memory device using an induced current generated on said conductive wiring by said radio wave as a source.

7. The thin film magnetic memory device according to claim 4, wherein in a process of manufacturing said plurality of magnetic memory cells, said second magnetic film is also formed flat on a same layer in a region corresponding to said antenna section.

8. The thin film magnetic memory device according to claim 4, wherein in a process of manufacturing said plurality of magnetic memory cells, said second magnetic film is also formed flat on a same layer in a region corresponding to said antenna section, a region corresponding to said array peripheral circuit section and a region corresponding to said peripheral circuit section.

9. The thin film magnetic memory device according to claim 4, further comprising a write signal line for writing said stored data to said plurality of magnetic memory cells, wherein said write signal line and said conductive wiring are formed on an upper layer of said first magnetic film in the same process, and said first magnetic film is formed for each of said conductive wiring and said write signal line to correspond to at least a portion right under each of said conductive wiring and said write signal wiring.

10. The thin film magnetic memory device according to claim 9, wherein in a region corresponding to said array peripheral circuit section and a region corresponding to said peripheral circuit section, said first magnetic film is not formed on a wiring formed on the same layer as a layer on which said write signal line and said conductive wiring are formed.

11. The thin film magnetic memory device according to claim 9, wherein in a region corresponding to said array peripheral circuit section and a region corresponding to said peripheral circuit section, said first magnetic film is formed in a same manner as said write signal line and said conductive wiring on a wiring formed on the same layer as a layer on which said write signal line and said conductive wiring are formed.

* * * * *